United States Patent
Tsai

(10) Patent No.: US 12,080,746 B2
(45) Date of Patent: Sep. 3, 2024

(54) METHOD FOR FABRICATING IMAGE SENSOR

(71) Applicant: TAIWAN SEMICONDUCTOR MANUFACTURING CO., LTD., Hsinchu (TW)

(72) Inventor: Bo-Tsung Tsai, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 77 days.

(21) Appl. No.: 17/738,409

(22) Filed: May 6, 2022

(65) Prior Publication Data

US 2022/0262843 A1 Aug. 18, 2022

Related U.S. Application Data

(63) Continuation of application No. 16/889,117, filed on Jun. 1, 2020, now Pat. No. 11,329,094, which is a continuation of application No. 15/655,957, filed on Jul. 21, 2017, now Pat. No. 10,672,824.

(60) Provisional application No. 62/429,961, filed on Dec. 5, 2016, provisional application No. 62/427,933, filed on Nov. 30, 2016.

(51) Int. Cl.
*H01L 27/146* (2006.01)

(52) U.S. Cl.
CPC .. *H01L 27/14638* (2013.01); *H01L 27/14616* (2013.01); *H01L 27/1463* (2013.01); *H01L 27/14634* (2013.01); *H01L 27/14636* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 8,564,034 B2 | 10/2013 | Masuoka et al. | |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 * | 11/2016 | Jiang | H01L 29/42392 |
| 9,520,482 B1 | 12/2016 | Chang et al. | |
| 9,536,738 B2 | 1/2017 | Huang et al. | |
| 9,576,814 B2 | 2/2017 | Wu et al. | |

(Continued)

*Primary Examiner* — Sarah K Salerno
(74) *Attorney, Agent, or Firm* — Birch, Stewart, Kolasch & Birch, LLP

(57) ABSTRACT

A method for fabricating an image sensor is provided. The method includes doping a bottom portion of a semiconductor substrate with a first dopant to form a light-sensitive element in the bottom portion of the semiconductor substrate; etching a top portion of the semiconductor substrate to form a post structure on the light-sensitive element; forming a gate structure on at least one sidewall of the post structure, wherein the gate structure exposes a first part of the bottom portion of the semiconductor substrate; doping the exposed first part of the bottom portion of the semiconductor substrate with a second dopant to form a pinning layer on the light-sensitive element, wherein the second dopant has a conductivity type opposite that of the first dopant; and forming a contact on the post structure.

19 Claims, 28 Drawing Sheets

(56) References Cited

U.S. PATENT DOCUMENTS

| | | | |
|---|---|---|---|
| 9,608,116 B2 | 3/2017 | Ching et al. | |
| 9,812,477 B2* | 11/2017 | Chou | H01L 27/14689 |
| 9,992,437 B1 | 6/2018 | Keung et al. | |
| 2006/0043126 A1* | 3/2006 | Wessbecher | B65D 21/0233 |
| | | | 222/541.3 |
| 2006/0186505 A1* | 8/2006 | Adkisson | H01L 27/14641 |
| | | | 257/E31.038 |
| 2007/0026326 A1* | 2/2007 | Kim | H01L 27/14643 |
| | | | 430/57.3 |
| 2011/0032405 A1 | 2/2011 | Nozaki et al. | |
| 2016/0043126 A1 | 2/2016 | Fan | |
| 2016/0056201 A1 | 2/2016 | Yamashita | |
| 2016/0204153 A1 | 7/2016 | Tayanaka | |
| 2017/0025452 A1 | 1/2017 | Sekisawa et al. | |
| 2018/0227521 A1 | 8/2018 | Keung et al. | |
| 2018/0301486 A1* | 10/2018 | Hung | H01L 27/14687 |

\* cited by examiner

METHOD FOR FABRICATING IMAGE SENSOR

RELATED APPLICATION

This application is a continuation of U.S. application Ser. No. 16/889,117, filed on Jun. 1, 2020, now U.S. Pat. No. 11,329,094, issued on May 10, 2022, which is a continuation of U.S. application Ser. No. 15/655,957, filed on Jul. 21, 2017, now U.S. Pat. No. 10,672,824, issued on Jun. 2, 2020, which claims the benefit of the Provisional Application Ser. No. 62/429,961, filed Dec. 5, 2016 and claims the benefit of the Provisional Application Ser. No. 62/427,933, filed Nov. 30, 2016. The entire disclosures of all the above applications are hereby incorporated by reference herein.

BACKGROUND

In semiconductor technology, image sensors are used for sensing light emitted towards them to form an image. The image sensor includes a dummy wafer and a sensing wafer bonded on the circuit wafer. The sensing wafer includes pixel units for converting various types of photo energy of light into electrical signals, and peripheral circuits of the pixel units. For example, the peripheral circuits include source followers to amplify the electrical signals.

In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
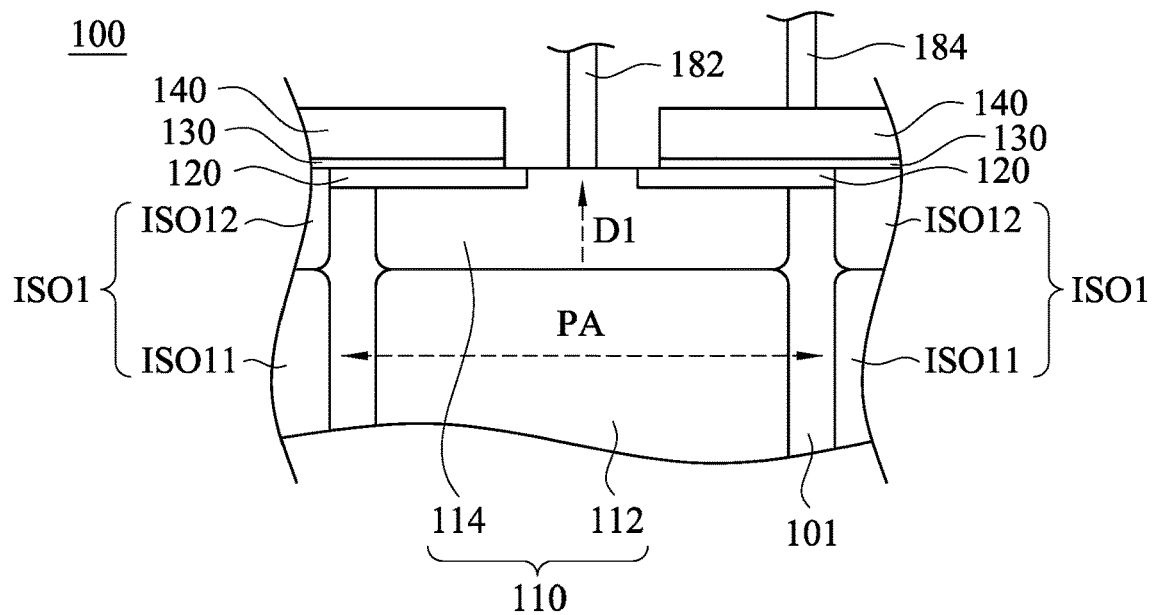
FIG. 1A is a schematic cross-sectional view of a pixel unit of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure are directed to a pixel unit of an image sensor. The pixel unit includes a semiconductor substrate, a light-sensitive element, a contact and a protection layer. The contact is disposed on the light-sensitive element to enable electrical signals outputted from the light-sensitive element to be transmitted to a peripheral circuit. The protection layer is disposed on the light-sensitive element and surrounds the first contact. The protection layer is configured to control the electrical signals outputted from the light-sensitive element to enable the electrical signals to be upward transmitted from the light-sensitive element to the peripheral circuit. Therefore, the light-sensitive element can occupy a big area, and high quantum efficiency (QE) is achieved accordingly.

Figure 1B:
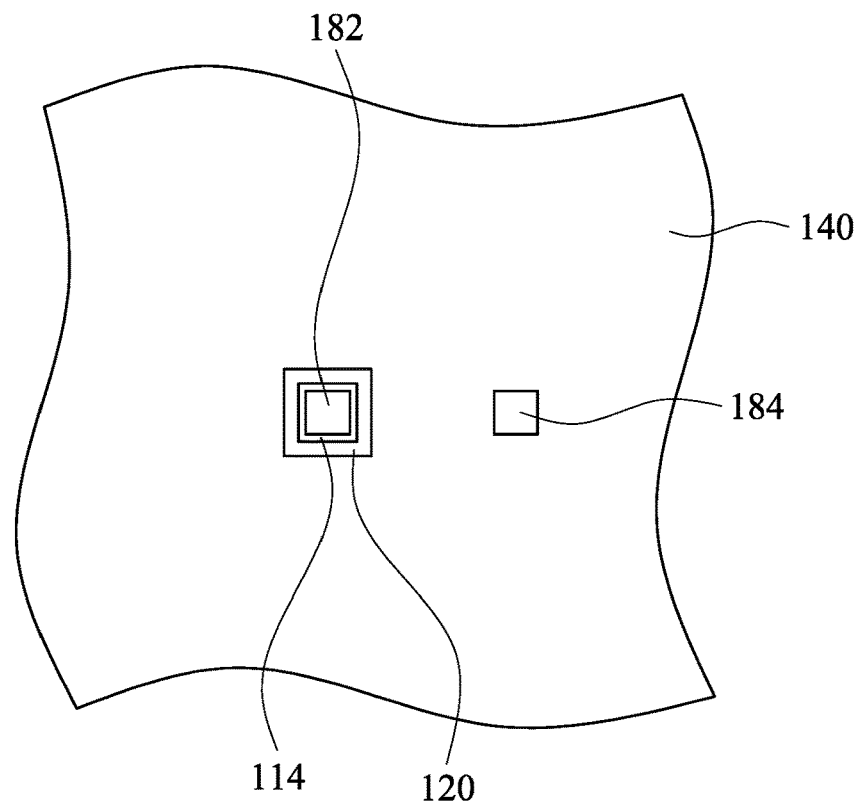
FIG. 1B to FIG. 1D are schematic top views of the pixel unit of an image sensor in accordance with some embodiments of the present disclosure.

Referring to FIG. 1A and FIG. 1B, FIG. 1A is a schematic cross-sectional view of a pixel unit 100 of an image sensor in accordance with some embodiments of the present disclosure, and FIG. 1B is a schematic top view of the pixel unit 100 of an image sensor in accordance with some embodiments of the present disclosure. The pixel unit 100 is formed in a semiconductor substrate 101 and defined by plural isolation structures ISO1. In this embodiment, the isolation structures ISO1 includes plural doped regions ISO11 and ISO12 doped with p-type dopant, but embodiments of the present disclosure are not limited thereto. In some embodiments, the isolation structures ISO1 are doped with p-type, n-type, or a combination thereof.

In some embodiments, the semiconductor substrate 101 may be a semiconductor material and may include structures including a graded layer or a buried oxide, for example. In some exemplary examples, the semiconductor substrate 101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 101. Alternatively, the semiconductor substrate 101 may be an active layer of a semiconductor-on-insulator (SOI) substrate or a multi-layered structure such as a silicon-germanium layer formed on a bulk silicon layer.

The pixel unit 100 includes a light-sensitive element 110, a protection layer 120, a gate dielectric layer 130, a conductive layer 140, and contacts 182 and 184, and the contact 182 is disposed on the doped region 114. In some embodiments, the contact 182 is formed right on the doped region 114. In some embodiments, the light-sensitive element 110 is a photodiode including doped regions 112 and 114. The doped regions 112 and 114 are formed by doping with a dopant of a first type. In some embodiments, the doped regions 112 and 114 are formed by doping with an n-type dopant. In some embodiments, the doped region 112 is doped at a first concentration, and the doped region 114 is doped at a second concentration greater than the first concentration. In some embodiments, the doped region 112 is doped at a concentration of about 1E12 atoms/cm$^3$, and the doped region 114 is doped at a concentration of about 5E12 atoms/cm$^3$, but embodiments of the present disclosure are not limited thereto.

The protection layer 120 is disposed on the light-sensitive element 110 to stabilize the light-sensitive element 110. The protection layer 120 may be referred to as a pinning layer and formed by doping with a dopant of a second type opposite to the first type. In some embodiments, the protection layer 120 surrounds the contact 182. In some embodiments, the protection layer 120 is formed by doping with a p-type dopant at a concentration of about 1E13 atoms/cm$^3$.

The gate dielectric layer 130 and the conductive layer 140 are sequentially disposed on the protection layer 120 and surround the contact 182, and the contact 184 is disposed on the conductive layer 140, thereby controlling the electrical signals outputted from the light-sensitive element 110. In some embodiments, the protection layer 120, the gate dielectric layer 130 and the conductive layer 140 are configured to induce a channel to enable the electrical signals outputted from the light-sensitive element 110 to be transmitted to a peripheral circuit (not shown).

In some embodiments, the gate dielectric layer 130 is formed by high-k dielectric material. The high-k material may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 140 is formed by doped poly-silicon, metal such as Al, Cu, W, Ti, Ta, TiN, TaN, NiSi, CoSi, other suitable conductive materials, or combinations thereof.

Therefore, when the light-sensitive element 110 converts photo energy of light into the electrical signals, the electrical signals can be upward transmitted to the peripheral circuit trough a channel induced by the protection layer 120, the gate dielectric layer 130 and the conductive layer 140 and through the contact 182. For example, a channel is induced by the protection layer 120, the gate dielectric layer 130 and the conductive layer 140 when a high voltage is applied on the conductive layer 140 through the contact 184, and thus the electrical signals are upward transmitted to the peripheral circuit trough the induced channel and the contact 182. In other words, the electrical signals are transmitted along the direction Dl. Since the electrical signals are upward transmitted, the sensitive element 110 can be designed to occupy a big area, a fill factor for full well capacity (FWC) and quantum efficiency (QE) are improved accordingly. Further, in some embodiments, the sensitive element 110 occupies substantially a whole pixel area PA defined by the two isolation structures ISO1, and thus the whole pixel area is covered by a gate structure (including the protection layer 120, the gate dielectric layer 130 and the conductive layer 140) and operated under revise bias during a pixel integration period to accumulate hole density for silicon surface isolation, thereby improving white pixel and dark current.

Figure 1C:
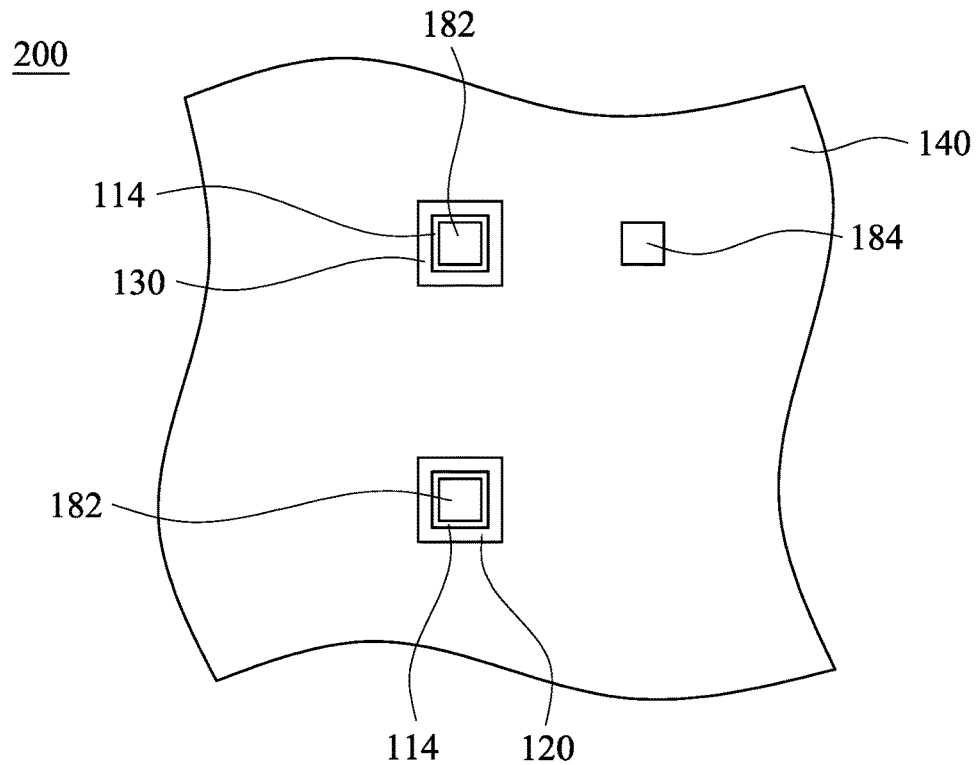
Figure 1D:
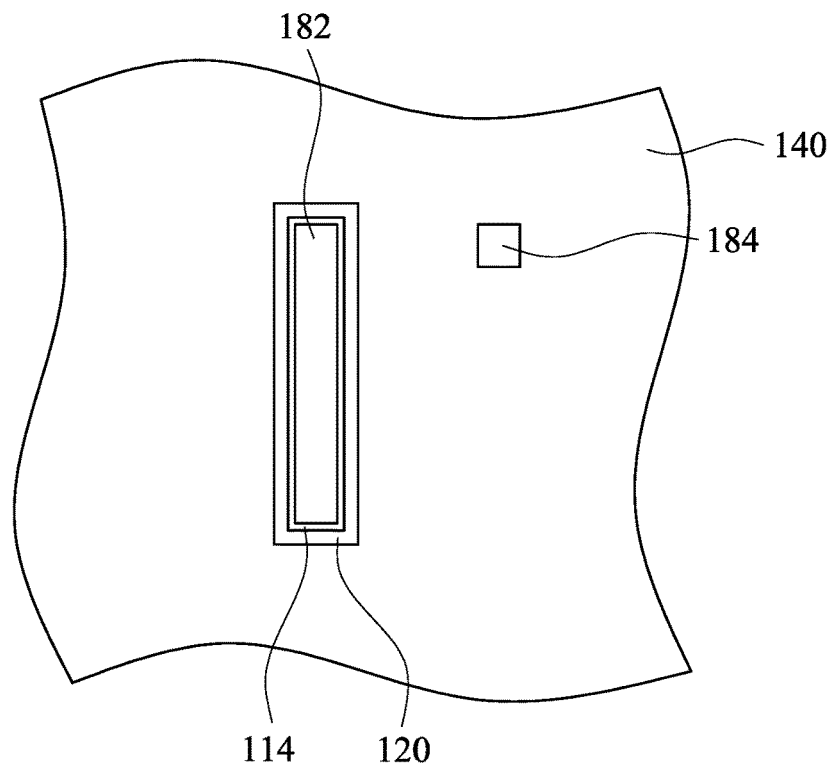

In some embodiments, the pixel unit 100 includes two contacts 182 for transmitting the electrical signals outputted from the light-sensitive element 110, as shown in FIG. 1C. In some embodiments, the contact 182 is in a rectangular form having longer sides and shorter sides, as shown in FIG. 1D.

Figure 2A:
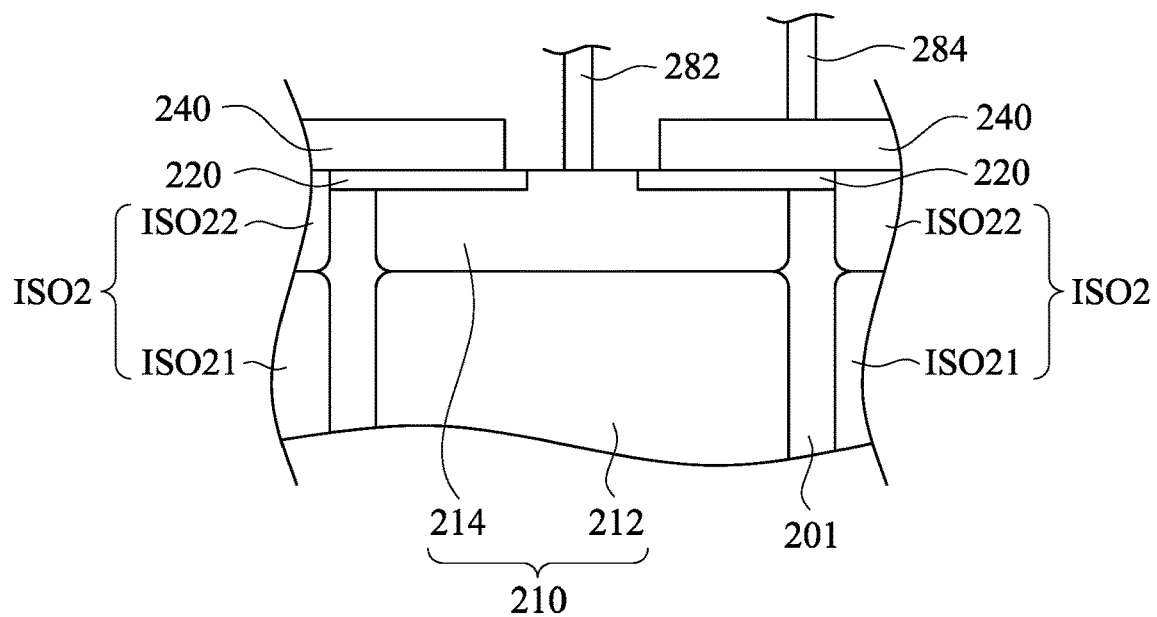
FIG. 2A is a schematic cross-sectional view of a pixel unit of an image sensor in accordance with some embodiments of the present disclosure.
Figure 2B:
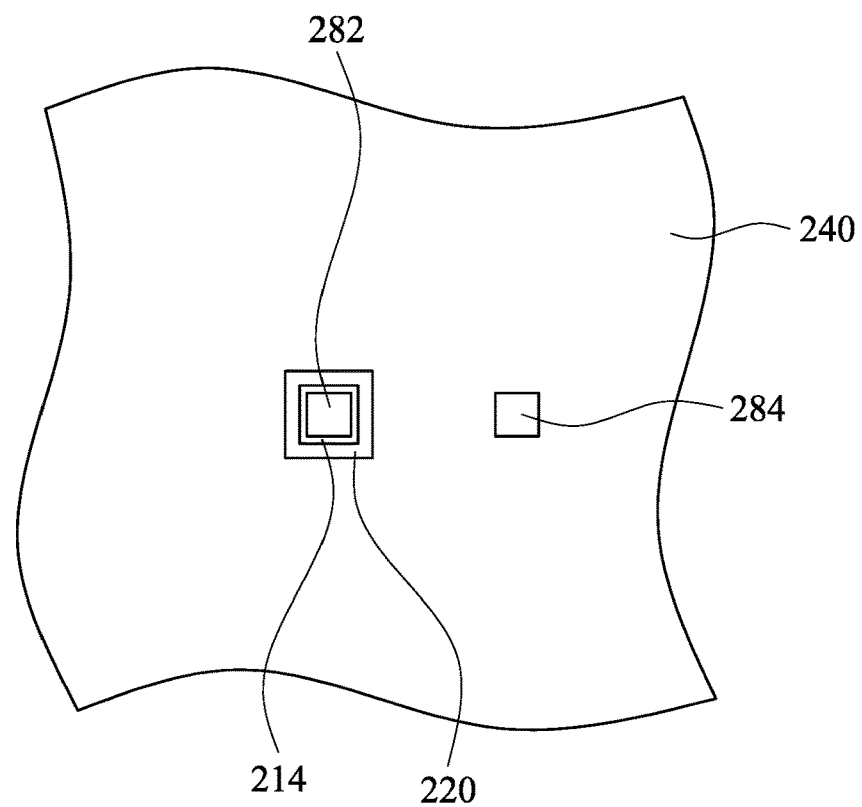
FIG. 2B is a schematic top view of the pixel unit of an image sensor in accordance with some embodiments of the present disclosure.

Referring to FIG. 2A and FIG. 2B, FIG. 2A is a schematic cross-sectional view of a pixel unit 200 of an image sensor in accordance with some embodiments of the present disclosure, and FIG. 2B is a schematic top view of the pixel unit 200 of an image sensor in accordance with some embodiments of the present disclosure. The pixel unit 200 is formed in a semiconductor substrate 201 and defined by plural isolation structures ISO2. In this embodiment, the isolation structures 1802 includes plural doped regions ISO21 and ISO22 formed by doping with p-type dopant, but embodiments of the present disclosure are not limited thereto. In some embodiments, the isolation structures ISO2 are formed by doping with p-type, n-type, or a combination thereof.

In some embodiments, the semiconductor substrate 201 may be a semiconductor material and may include structures including a graded layer or a buried oxide, for example. In some exemplary examples, the semiconductor substrate 201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 201. Alternatively, the semiconductor substrate 201 may be an active layer of a semiconductor-on-insulator (SOI) substrate or a multi-layered structure such as a silicon-germanium layer formed on a bulk silicon layer.

The pixel unit 200 includes a light-sensitive element 210, a protection layer 220, a conductive layer 240, and contacts 282 and 284. In some embodiments, the light-sensitive element 210 is a photodiode including doped regions 212 and 214, and the contact 282 is disposed on the doped region 214. In some embodiments, the contact 282 is formed right on the doped region 214. The doped regions 212 and 214 are formed by doping with a dopant of a first type. In some embodiments, the doped regions 212 and 214 are formed by doping with an n-type dopant. In some embodiments, the doped region 212 is doped at a first concentration, and the doped region 214 is doped at a second concentration greater than the first concentration. In some embodiments, the doped region 212 is doped at a concentration of about 1E12 atoms/cm$^3$, and the doped region 214 is doped at a concentration of about 5E12 atoms/cm$^3$, but embodiments of the present disclosure are not limited thereto.

The protection layer 220 is disposed on the light-sensitive element 210 to stabilize the light-sensitive element 210. The protection layer 220 may be referred to as a pinning layer and formed by doping with a dopant of a second type opposite to the first type. In some embodiments, the protection layer 220 surrounds the contact 282. In some embodiments, the protection layer 220 is formed by doping with a p-type dopant at a concentration of about 1E13 atoms/cm$^3$.

The conductive layer 240 is disposed on the protection layer 220 and surrounds the contact 282, and the contact 284 is disposed on the conductive layer 240, thereby controlling the electrical signals outputted from the light-sensitive element 210. In some embodiments, the protection layer 220 and the conductive layer 240 are configured to induce a channel to enable the electrical signals outputted from the light-sensitive element 210 to be transmitted to a peripheral circuit (not shown). In some embodiments, the conductive layer 240 is formed by doped poly-silicon, metal such as Al, Cu, W, Ti, Ta, TiN, TaN, NiSi, CoSi, other suitable conductive materials, or combinations thereof.

Therefore, when the light-sensitive element 210 converts photo energy of light into the electrical signals, the electrical signals can be upward transmitted to the peripheral circuit trough a channel induced by the protection layer 220 and the conductive layer 240 and through the contact 282. For example, a channel is induced by the protection layer 220 and the conductive layer 240 when a high voltage is applied on the conductive layer 240 through the contact 284, and thus the electrical signals are upward transmitted to the peripheral circuit trough the induced channel and the contact 282.

Figure 3A:
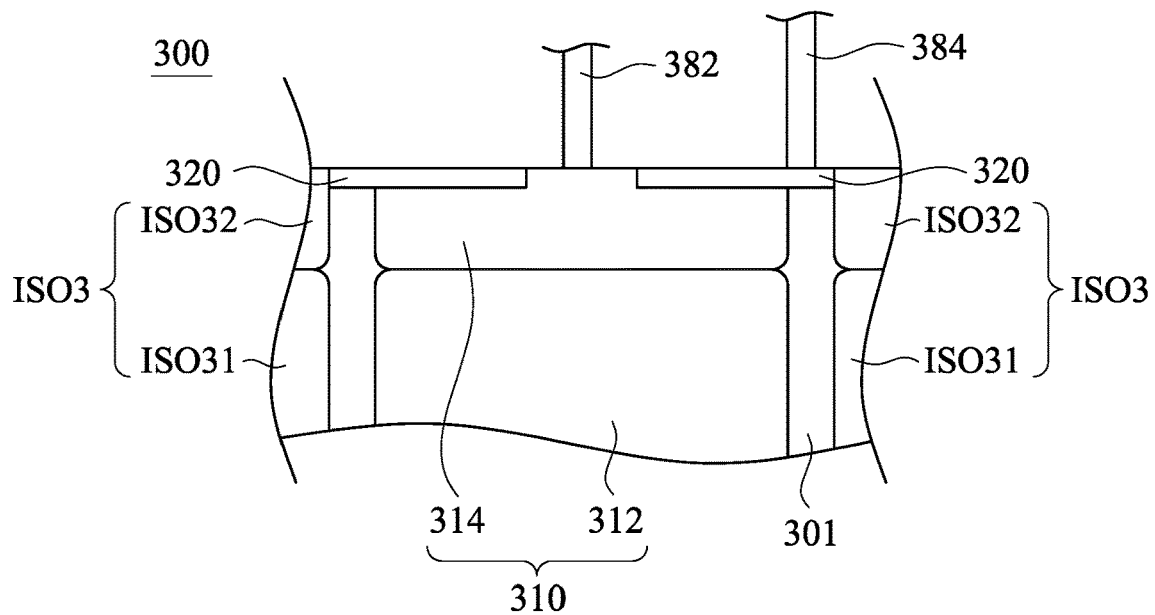
FIG. 3A is a schematic cross-sectional view of a pixel unit of an image sensor in accordance with some embodiments of the present disclosure.
Figure 3B:
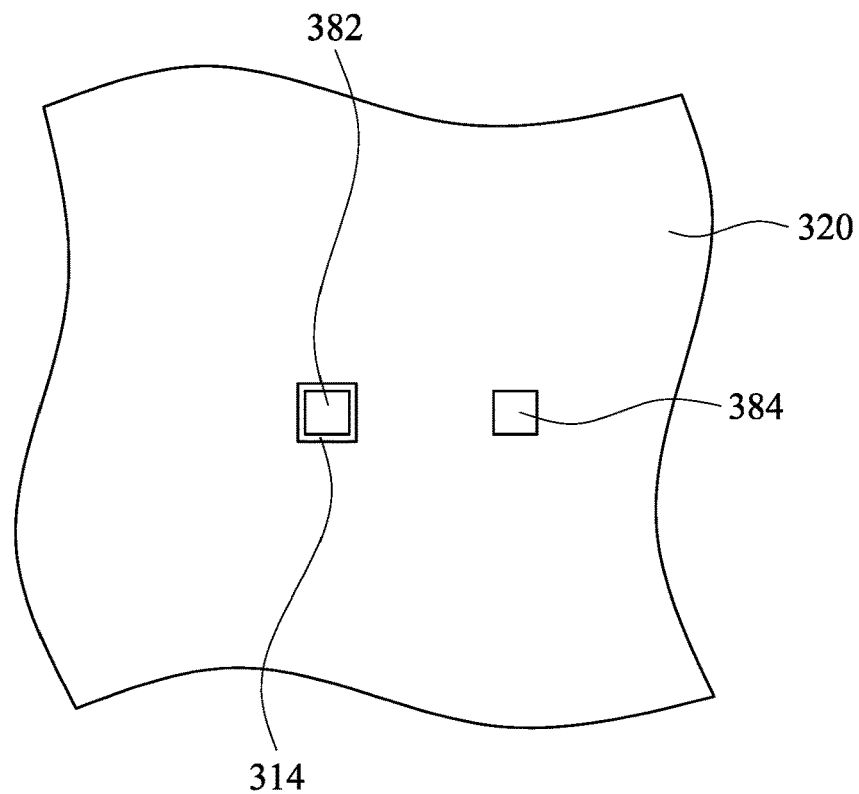
FIG. 3B is a schematic top view of the pixel unit of an image sensor in accordance with some embodiments of the present disclosure.

Referring to FIG. 3A and FIG. 3B, FIG. 3A is a schematic cross-sectional view of a pixel unit 300 of an image sensor in accordance with some embodiments of the present disclosure, and FIG. 3B is a schematic top view of the pixel unit 300 of an image sensor in accordance with some embodiments of the present disclosure. The pixel unit 300 is formed in a semiconductor substrate 301 and defined by plural isolation structures ISO3. In this embodiment, the isolation structures ISO3 includes plural doped regions ISO31 and ISO32 formed by doping with p-type dopant, but embodiments of the present disclosure are not limited thereto. In some embodiments, the isolation structures ISO3 are formed by doping with p-type, n-type, or a combination thereof.

In some embodiments, the semiconductor substrate 301 may be a semiconductor material and may include structures including a graded layer or a buried oxide, for example. In some exemplary examples, the semiconductor substrate 201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 301. Alternatively, the semiconductor substrate 301 may be an active layer of a semiconductor-on-insulator (SOI) substrate or a multi-layered structure such as a silicon-germanium layer formed on a bulk silicon layer.

The pixel unit 300 includes a light-sensitive element 310, a protection layer 320, and contacts 382 and 384. In some embodiments, the light-sensitive element 310 is a photodiode including doped regions 312 and 314, and the contact 382 is disposed on the doped region 314. In some embodiments, the contact 382 is formed right on the doped region 314. The doped regions 312 and 314 are formed by doping with a dopant of a first type. In some embodiment, the doped regions 312 and 314 are formed by doping with an n-type dopant. In some embodiments, the doped region 312 is doped at a first concentration, and the doped region 314 is doped at a second concentration greater than the first concentration. In some embodiments, the doped region 312 is doped at a concentration of about 1E12 atoms/cm$^3$, and the doped region 314 is doped at a concentration of about 5E12 atoms/cm$^3$, but embodiments of the present disclosure are not limited thereto.

The protection layer 320 is disposed on the light-sensitive element 310 to stabilize the light-sensitive element 310. The protection layer 320 may be referred to as a pinning layer and formed by doping with a dopant of a second type opposite to the first type. In some embodiments, the protection layer 320 surrounds the contact 382. In some embodiments, the protection layer 320 is formed by doping with a p-type dopant at a concentration of about 1E13 atoms/cm$^3$.

When the light-sensitive element 310 converts photo energy of light into the electrical signals, the electrical signals can be upward transmitted to the peripheral circuit trough a channel induced by the protection layer 320 (since a PNP structure is formed adjacent to the contact 382) and through the contact 382. For example, a channel is induced by the protection layer 320 when a high voltage is applied on the protection layer 320 through the contact 384, and thus the electrical signals are upward transmitted to the peripheral circuit trough the induced channel and the contact 382.

Figure 4A:
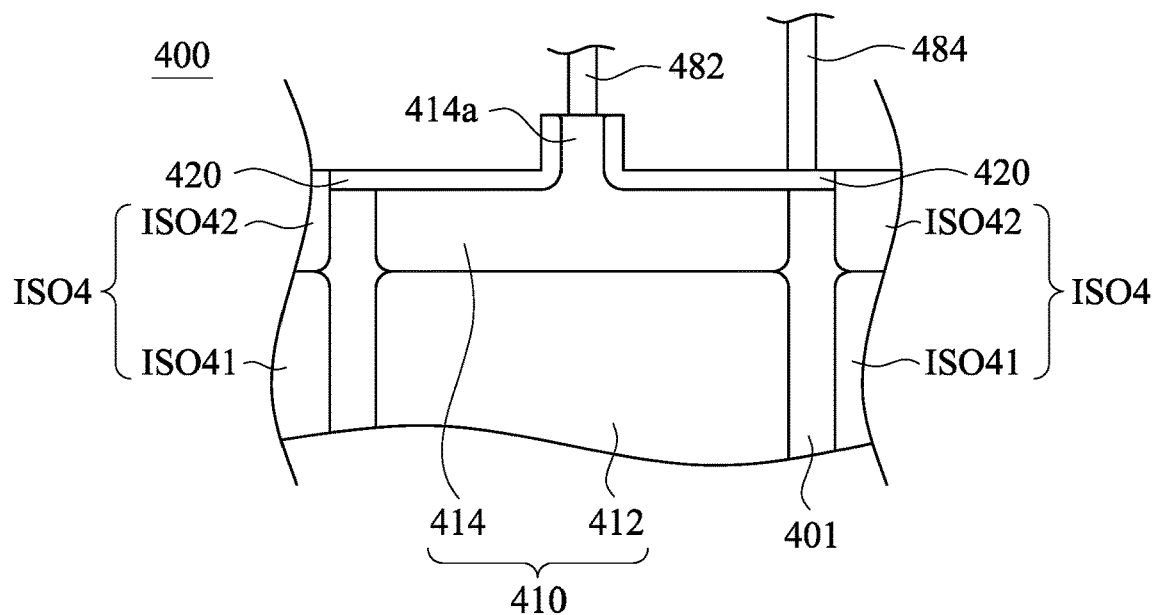
FIG. 4A is a schematic cross-sectional view of a pixel unit of an image sensor in accordance with some embodiments of the present disclosure.
Figure 4B:
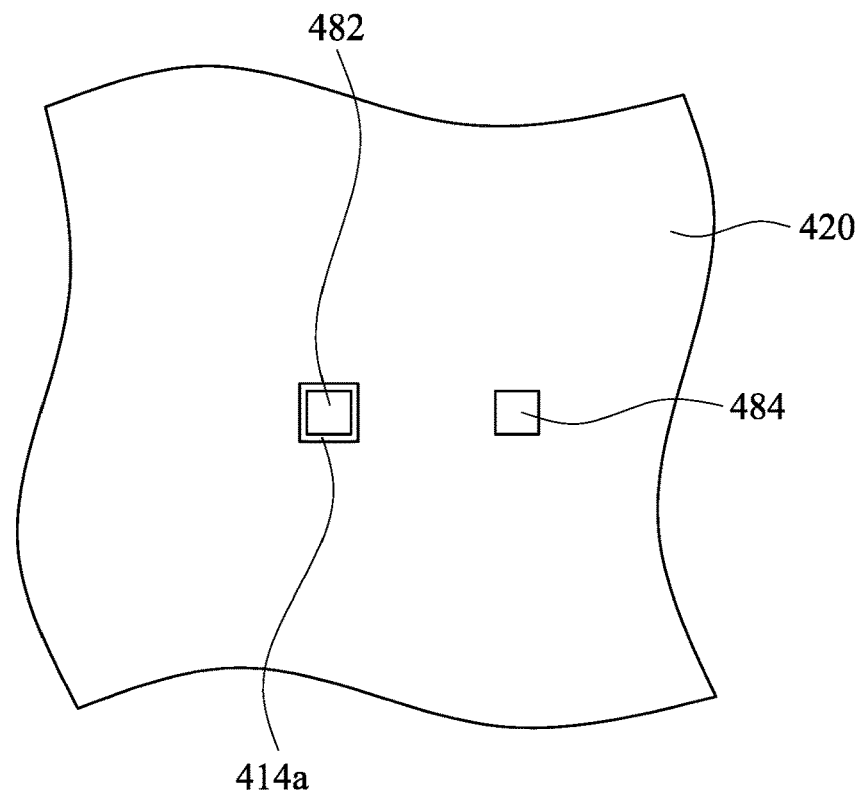
FIG. 4B is a schematic top view of the pixel unit of an image sensor in accordance with some embodiments of the present disclosure.

Referring to FIG. 4A and FIG. 4B, FIG. 4A is a schematic cross-sectional view of a pixel unit 400 of an image sensor in accordance with some embodiments of the present disclosure, and FIG. 4B is a schematic top view of the pixel unit 400 of an image sensor in accordance with some embodiments of the present disclosure. The pixel unit 400 is formed in a semiconductor substrate 401 and defined by plural isolation structures ISO4. In this embodiment, the isolation structures ISO4 includes plural doped regions ISO41 and ISO42 formed by doping with p-type dopant, but embodiments of the present disclosure are not limited thereto. In some embodiments, the isolation structures ISO4 are formed by doping with p-type, n-type, or a combination thereof.

In some embodiments, the semiconductor substrate 401 may be a semiconductor material and may include structures including a graded layer or a buried oxide, for example. In some exemplary examples, the semiconductor substrate 401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 401. Alternatively, the semiconductor substrate 401 may be an active layer of a semiconductor-on-insulator (SOI) substrate or a multi-layered structure such as a silicon-germanium layer formed on a bulk silicon layer.

The pixel unit 400 includes a light-sensitive element 410, a protection layer 420, and contacts 482 and 484. In some embodiments, the light-sensitive element 410 is a photodiode including doped regions 412 and 414 formed by doping with a dopant of a first type. The doped region 414 has a protrusion portion 414a, and the contact 482 is disposed on the protrusion portion 414a. In some embodiments, the contact 482 is formed right on the protrusion portion 414a.

In some embodiments, the doped regions 412 and 414 are formed by doping with an n-type dopant. In some embodiments, the doped region 412 is doped at a first concentration, and the doped region 414 is doped at a second concentration greater than the first concentration. In some embodiments, the doped region 412 is doped at a concentration of about 1E12 atoms/cm$^3$, and the doped region 414 is doped at a concentration of about 5E12 atoms/cm$^3$, but embodiments of the present disclosure are not limited thereto.

The protection layer 420 is disposed on the light-sensitive element 410 to stabilize the light-sensitive element 410. The protection layer 420 may be referred to as a pinning layer and formed by doping with a dopant of a second type opposite to the first type. In some embodiments, the protection layer 420 is formed by doping with a p-type dopant at a concentration of about 1E13 atoms/cm$^3$. In some embodiments, the protection layer 420 is formed to cover sidewalls of the protrusion portion 414a and surrounds the contact 482.

When the light-sensitive element 410 converts photo energy of light into the electrical signals, the electrical signals can be upward transmitted to the peripheral circuit trough a channel induced by the protection layer 420 (since a PNP structure is formed adjacent to the contact 482) and through the contact 482. For example, a channel is induced by the protection layer 420 when a high voltage is applied on the protection layer 420 through the contact 484, and thus the electrical signals are upward transmitted to the peripheral circuit trough the induced channel and the contact 482.

Figure 5A:
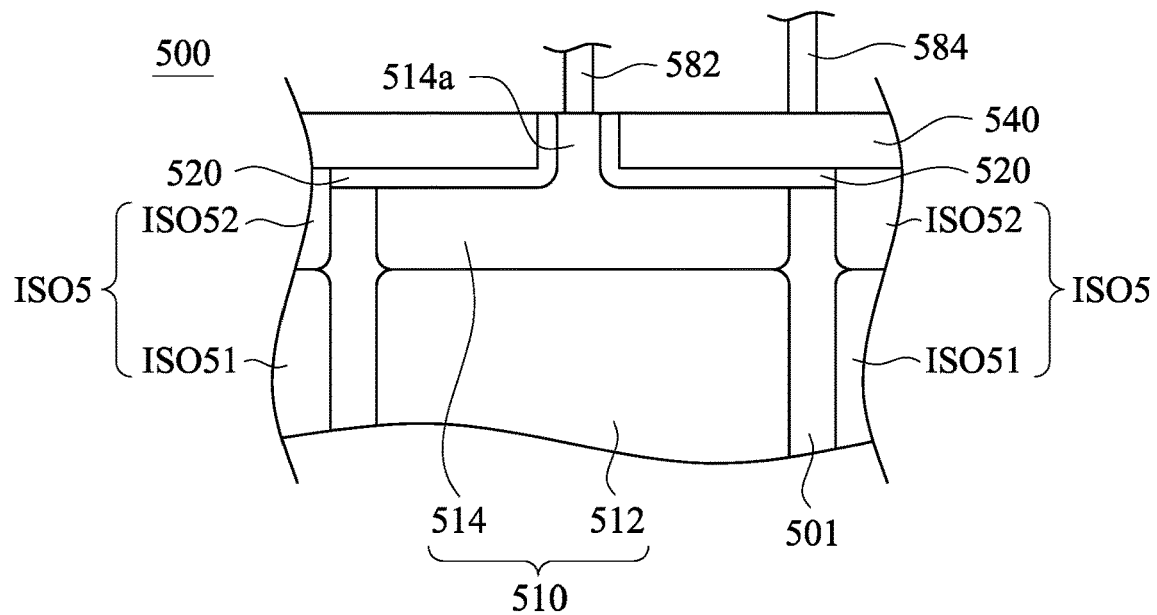
FIG. 5A is a schematic cross-sectional view of a pixel unit of an image sensor in accordance with some embodiments of the present disclosure.
Figure 5B:
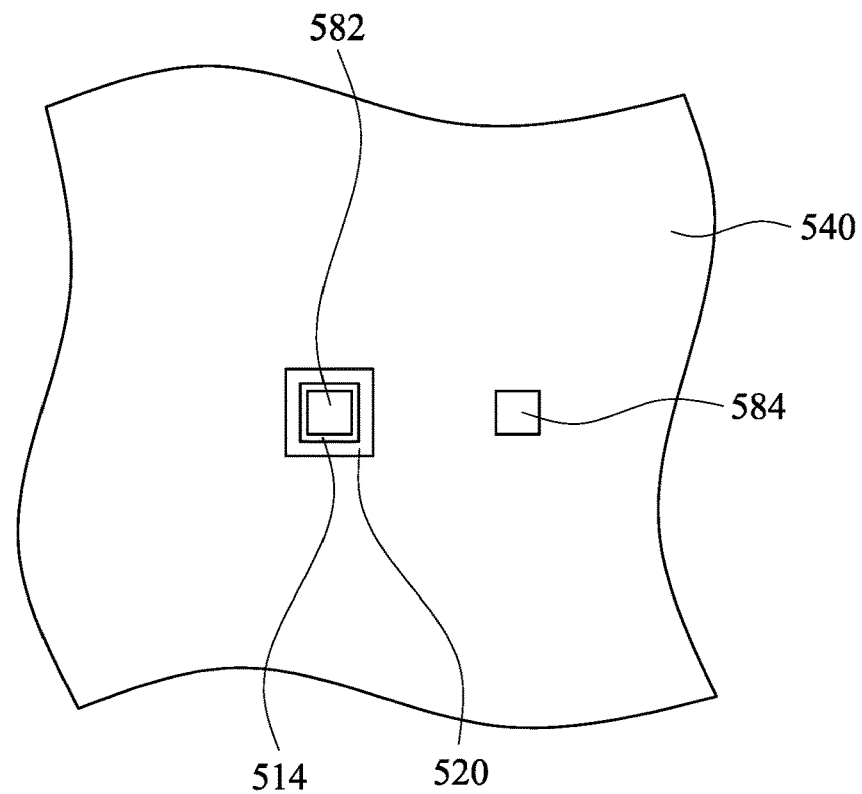
FIG. 5B is a schematic top view of the pixel unit of an image sensor in accordance with some embodiments of the present disclosure.

Referring to FIG. 5A and FIG. 5B, FIG. 5A is a schematic cross-sectional view of a pixel unit 500 of an image sensor in accordance with some embodiments of the present disclosure, and FIG. 5B is a schematic top view of the pixel unit 500 of an image sensor in accordance with some embodiments of the present disclosure. The pixel unit 500 is formed in a semiconductor substrate 501 and defined by plural isolation structures ISO5. In this embodiment, the isolation structures ISO5 includes plural doped regions ISO51 and ISO52 formed by doping with p-type dopant, but embodiments of the present disclosure are not limited thereto. In some embodiments, the isolation structures ISO5 are formed by doping with p-type, n-type, or a combination thereof.

In some embodiments, the semiconductor substrate 501 may be a semiconductor material and may include structures including a graded layer or a buried oxide, for example. In some exemplary examples, the semiconductor substrate 501 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 501. Alternatively, the semiconductor substrate 501 may be an active layer of a semiconductor-on-insulator (SOI) substrate or a multi-layered structure such as a silicon-germanium layer formed on a bulk silicon layer.

The pixel unit 500 includes a light-sensitive element 510, a protection layer 520, a conductive layer 540, and contacts 582 and 584. In some embodiments, the light-sensitive element 510 is a photodiode including doped regions 512 and 514. The doped regions 512 and 514 are formed by doping with a dopant of a first type. The doped region 514 has a protrusion portion 514a, and the contact 582 is disposed on the protrusion portion 514a. In some embodiments, the contact 582 is formed right on the protrusion portion 414a.

In some embodiments, the doped regions 512 and 514 are formed by doping with an n-type dopant. In some embodiments, the doped region 512 is doped at a first concentration, and the doped region 514 is doped at a second concentration greater than the first concentration. In some embodiments, the doped region 512 is doped at a concentration of about 1E12 atoms/cm$^3$, and the doped region 514 is doped at a concentration of about 5E12 atoms/cm$^3$, but embodiments of the present disclosure are not limited thereto.

The protection layer 520 is disposed on the light-sensitive element 510 to stabilize the light-sensitive element 510. The protection layer 520 may be referred to as a pinning layer and formed by doping with a dopant of a second type opposite to the first type. In some embodiments, the protection layer 520 is formed by doping with a p-type dopant at a concentration of about 1E13 atoms/cm$^3$. In some embodiments, the protection layer 520 is formed to cover sidewalls of the protrusion portion 514a and surrounds the contact 582.

The conductive layer 540 is disposed on the protection layer 520 and surrounds the contact 582, and the contact 584 is disposed on the conductive layer 540, thereby controlling the electrical signals outputted from the light-sensitive element 510. In some embodiments, the protection layer 520 and the conductive layer 540 are configured to induce a channel to enable the electrical signals outputted from the light-sensitive element 510 to be transmitted to a peripheral circuit. In some embodiments, the conductive layer 540 is formed by doped poly-silicon, metal such as Al, Cu, W, Ti, Ta, TiN, TaN, NiSi, CoSi, other suitable conductive materials, or combinations thereof.

Therefore, when the light-sensitive element 510 converts photo energy of light into the electrical signals, the electrical signals can be upward transmitted to the peripheral circuit trough a channel induced by the protection layer 520 and the conductive layer 540 and through the contact 582. For example, a channel is induced by the protection layer 520 and the conductive layer 540 when a high voltage is applied on the conductive layer 540 through the contact 584, and thus the electrical signals are upward transmitted to the peripheral circuit trough the induced channel and the contact 582.

Figure 6A:
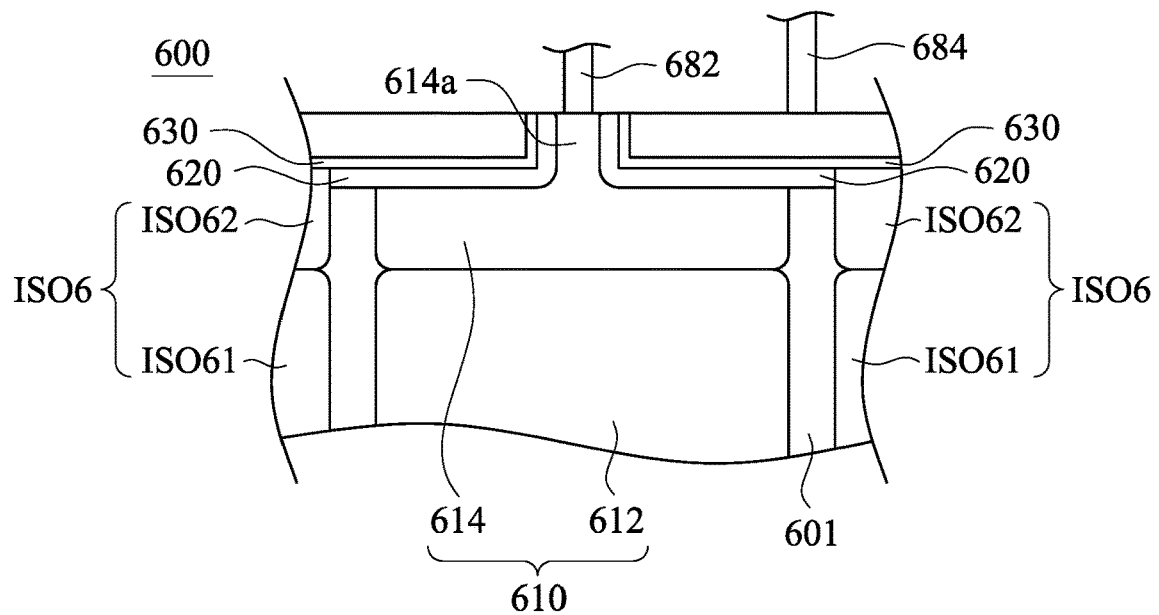
FIG. 6A is a schematic cross-sectional view of a pixel unit of an image sensor in accordance with some embodiments of the present disclosure.
Figure 6B:
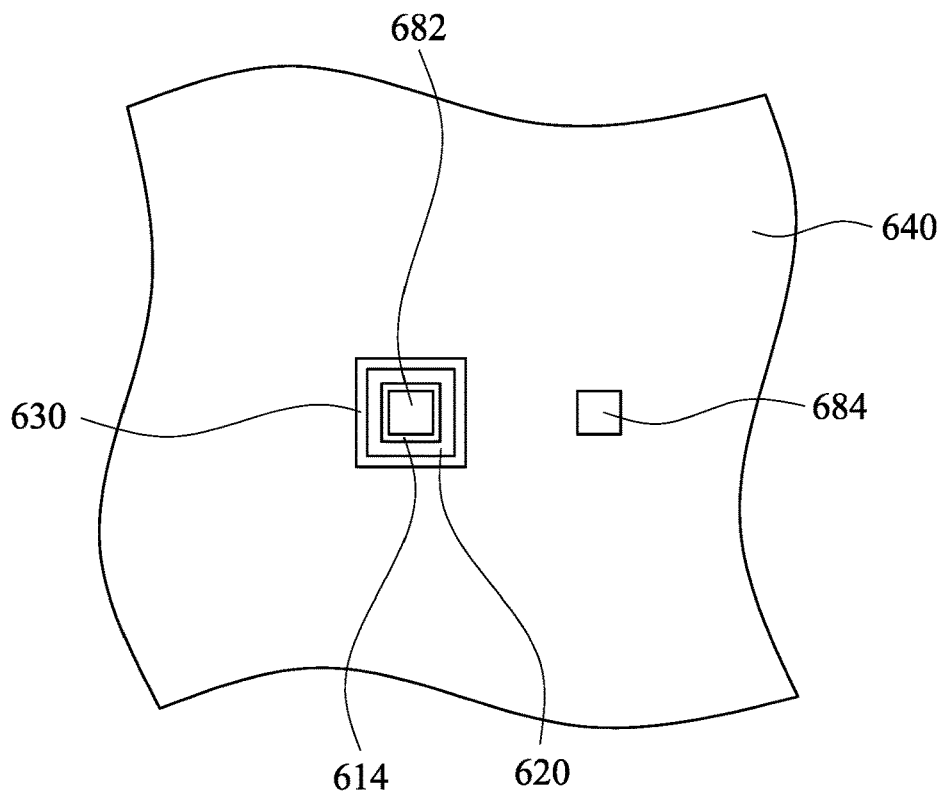
FIG. 6B is a schematic top view of the pixel unit of an image sensor in accordance with some embodiments of the present disclosure.

Referring to FIG. 6A and FIG. 6B, FIG. 6A is a schematic cross-sectional view of a pixel unit 600 of an image sensor in accordance with some embodiments of the present disclosure, and FIG. 6B is a schematic top view of the pixel unit 600 of an image sensor in accordance with some embodiments of the present disclosure. The pixel unit 600 is formed in a semiconductor substrate 601 and defined by plural isolation structures ISO6. In this embodiment, the isolation structures ISO6 includes plural doped regions ISO61 and ISO62 formed by doping with p-type dopant, but embodiments of the present disclosure are not limited thereto. In some embodiments, the isolation structures ISO6 are doped with p-type, n-type, or a combination thereof.

In some embodiments, the semiconductor substrate 601 may be a semiconductor material and may include structures including a graded layer or a buried oxide, for example. In some exemplary examples, the semiconductor substrate 601 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 601. Alternatively, the semiconductor substrate 601 may be an active layer of a semiconductor-on-insulator (SOI) substrate or a multi-layered structure such as a silicon-germanium layer formed on a bulk silicon layer.

The pixel unit 600 includes a light-sensitive element 610, a protection layer 620, a gate dielectric layer 630, a conductive layer 640, and contacts 682 and 684, and the contact 682 is disposed on the doped region 614. In some embodiments, the contact 682 is formed right on the doped region 614. In some embodiments, the light-sensitive element 610 is a photodiode including doped regions 612 and 614. The doped regions 612 and 614 are formed by doping with a dopant of a first type. The doped region 614 has a protrusion portion 614a, and the contact 682 is disposed on the protrusion portion 614a. In some embodiments, the contact 682 is formed right on the protrusion portion 614a.

In some embodiments, the doped regions 612 and 614 are formed by doping with an n-type dopant. In some embodiments, the doped region 612 is doped at a first concentration, and the doped region 614 is doped at a second concentration greater than the first concentration. In some embodiments, the doped region 612 is doped at a concentration of about 1E12 atoms/cm$^3$, and the doped region 614 is doped at a concentration of about 5E12 atoms/cm$^3$, but embodiments of the present disclosure are not limited thereto.

The protection layer 620 is disposed on the light-sensitive element 610 to stabilize the light-sensitive element 610. The protection layer 620 may be referred to as a pinning layer and formed by doping with a dopant of a second type opposite to the first type. In some embodiments, the protection layer 620 surrounds the contact 682. In some embodiments, the protection layer 620 is formed by doping with a p-type dopant at a concentration of about 1E13 atoms/cm$^3$. In some embodiments, the protection layer 620 is formed to cover sidewalls of the protrusion portion 614a and surrounds the contact 682.

The gate dielectric layer 630 and the conductive layer 640 are sequentially disposed on the protection layer 620 and surround the contact 682, and the contact 684 is disposed on the conductive layer 640, thereby controlling the electrical signals outputted from the light-sensitive element 610. In some embodiments, the protection layer 620, the gate dielectric layer 630 and the conductive layer 640 are configured to induce a channel to enable the electrical signals outputted from the light-sensitive element 610 to be transmitted to a peripheral circuit.

In some embodiments, the gate dielectric layer 630 is formed by high-k dielectric material. The high-k material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 640 is formed by doped poly-silicon, metal such as Al, Cu, W, Ti, Ta, TiN, TaN, NiSi, CoSi, other suitable conductive materials, or combinations thereof.

Therefore, when the light-sensitive element 610 converts photo energy of light into the electrical signals, the electrical signals can be upward transmitted to the peripheral circuit trough a channel induced by the protection layer 620, the gate dielectric layer 630 and the conductive layer 640 and through the contact 682. For example, a channel is induced by the protection layer 620, the gate dielectric layer 630 and the conductive layer 640 when a high voltage is applied on the conductive layer 640 through the contact 684, and thus the electrical signals are upward transmitted to the peripheral circuit trough the induced channel and the contact 682. Further, in some embodiments, the sensitive element 610 occupies substantially a whole pixel area defined by the two isolation structures 1506, and thus the whole pixel area is covered by a gate structure (including the protection layer 620, the gate dielectric layer 630 and the conductive layer 640).

Figure 7A:
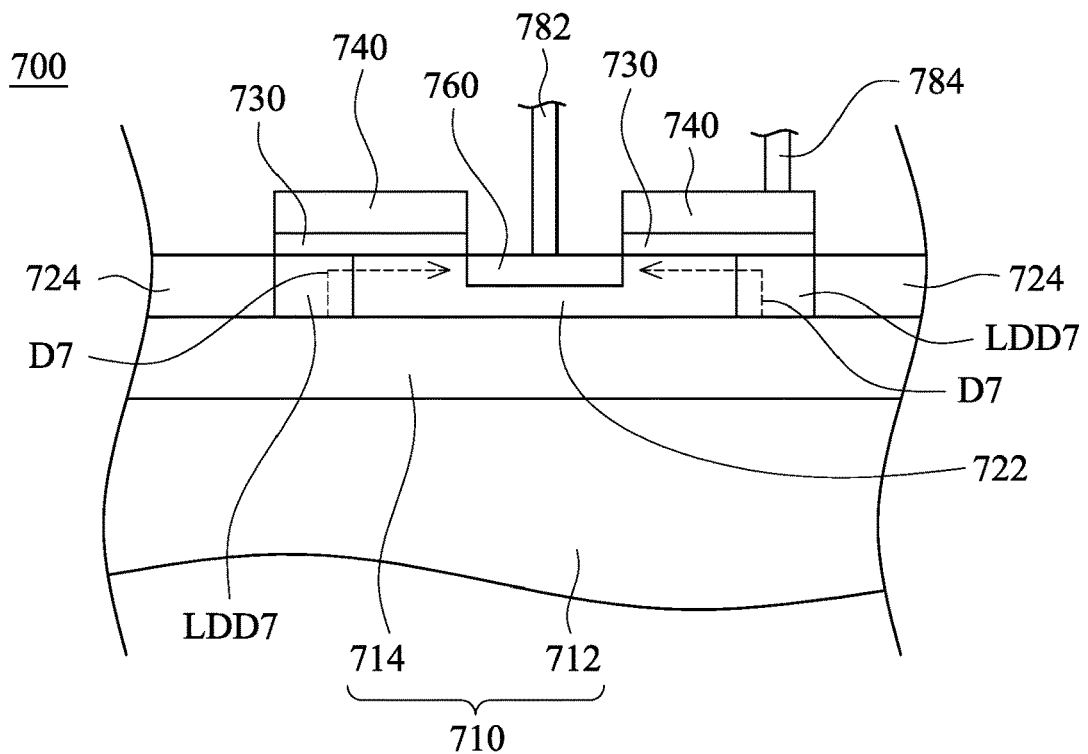
FIG. 7A is a schematic cross-sectional view of a pixel unit of an image sensor in accordance with some embodiments of the present disclosure.
Figure 7B:
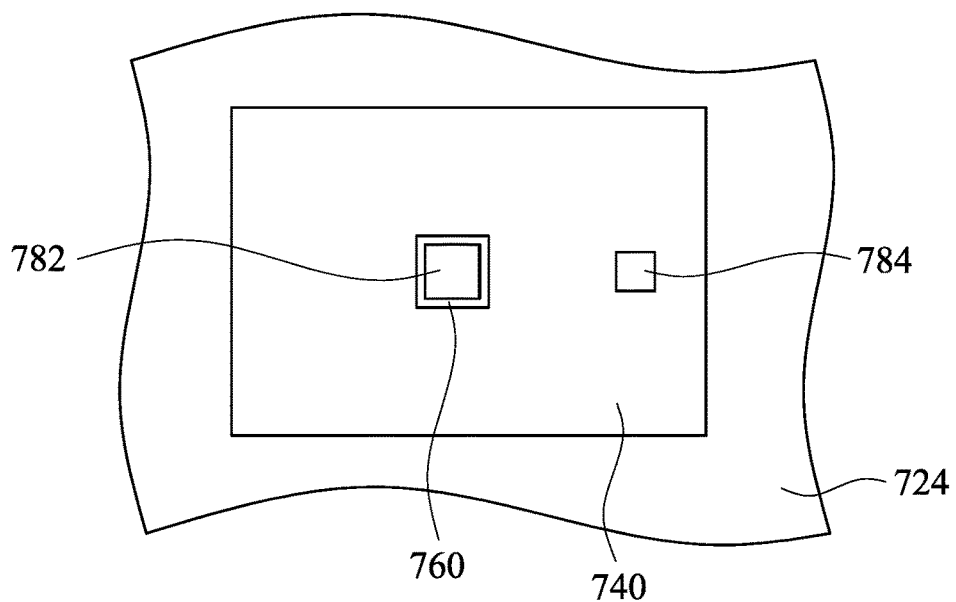
FIG. 7B is a schematic top view of the pixel unit of an image sensor in accordance with some embodiments of the present disclosure.

Referring to FIG. 7A and FIG. 7B, FIG. 7A is a schematic cross-sectional view of a pixel unit 700 of an image sensor in accordance with some embodiments of the present disclosure, and FIG. 7B is a schematic top view of the pixel unit 700 of an image sensor in accordance with some embodiments of the present disclosure. The pixel unit 700 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 700 includes a light-sensitive element 710, protection layers 722 and 724, a lightly-doped region LDD7, a gate dielectric layer 730, a conductive layer 740, a floating node 760, and contacts 782 and 784. In some embodiments, the light-sensitive element 710 is a photodiode including doped regions 712 and 714. The doped regions 712 and 714 are formed by doping with a dopant of a first type. In some embodiment, the doped regions 712 and 714 are formed by doping with an n-type dopant. In some embodiments, the doped region 712 is doped at a first concentration, and the doped region 714 is doped at a second concentration greater than the first concentration. In some embodiments, the doped region 712 is doped at a concentration of about 1E12 atoms/cm3, and the doped region 714 is doped at a concentration of about 5E12 atoms/cm3, but embodiments of the present disclosure are not limited thereto.

The protection layers 722 and 724 are disposed on the light-sensitive element 710 to stabilize the light-sensitive element 710. The protection layers 722 and 724 may be referred to as a pinning layer and formed by doping with a dopant of a second type opposite to the first type. In some embodiments, the protection layers 722 and 724 surround the contact 782. In some embodiments, the protection layers 722 and 724 are formed by doping with a p-type dopant at a concentration of about 1E13 atoms/cm3.

The lightly-doped region LDD7 is disposed on the light-sensitive element 710. In some embodiments, the lightly-doped region LDD7 is located between the protection layers 722 and 724 and surrounds the contact 782. The lightly-doped region LDD7 is formed by doping with a dopant of the first type. In some embodiment, the lightly-doped region LDD7 is formed by doping with an n-type dopant. In some embodiments, the lightly-doped region LDD7 is doped at a concentration smaller than the doping concentration of the doped region 714. In some embodiments, the lightly-doped region LDD7 is doped at a concentration of about 2.5E12 atoms/cm3, but embodiments of the present disclosure are not limited thereto.

The gate dielectric layer 730 and the conductive layer 740 are sequentially disposed on the light-sensitive element 710 and surround the contact 782, and the contact 784 is disposed on the conductive layer 740. In some embodiments, the gate dielectric layer 730 and the conductive layer 740 covers the lightly-doped region LDD7 and a portion of the protection layer 722. In some embodiments, the gate dielectric layer 730 is formed by high-k dielectric material. The high-k material may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 740 is formed by doped poly-silicon, metal such as Al, Cu, W, Ti, Ta, TiN, TaN, NiSi, CoSi, other suitable conductive materials, or combinations thereof.

The floating node 760 is disposed in the protection layer 722, and the contact 782 is disposed on the floating node 760. In some embodiments, the floating node 760 is formed by doping the protection layer 722 with an n-type dopant at a concentration of about 1E15 atoms/cm3.

When the light-sensitive element 710 converts photo energy of light into the electrical signals, the electrical signals can be upward transmitted to the peripheral circuit trough a channel induced by the gate dielectric layer 730 and the conductive layer 740 and through the contact 782. For example, a channel is induced by the gate dielectric layer 730 and the conductive layer 740 when a high voltage is applied on the conductive layer 740 through the contact 784, and thus the electrical signals are upward transmitted to the peripheral circuit along a direction D7.

Figure 8A:
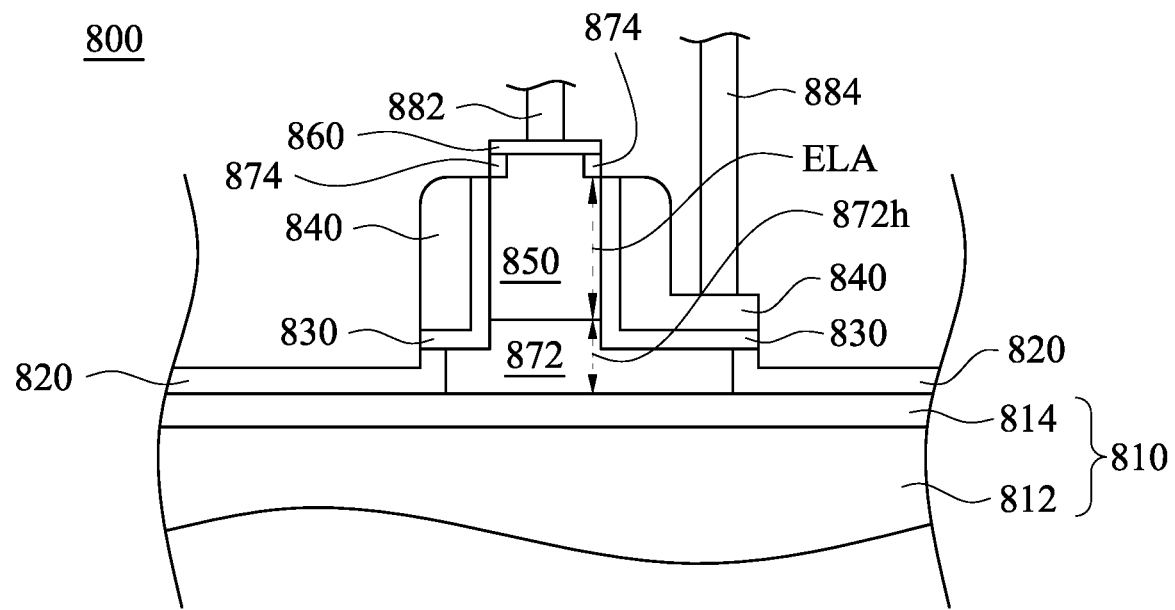
FIG. 8A is a schematic cross-sectional view of a pixel unit of an image sensor in accordance with some embodiments of the present disclosure.
Figure 8B:
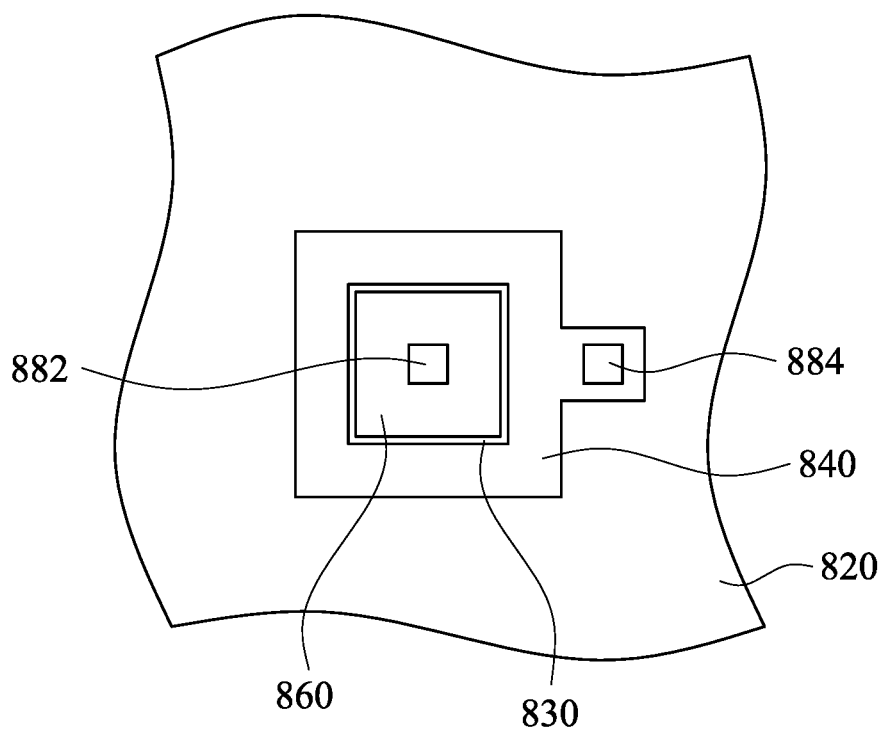
FIG. 8B is a schematic top view of the pixel unit of an image sensor in accordance with some embodiments of the present disclosure.

Referring to FIG. 8A and FIG. 8B, FIG. 8A is a schematic cross-sectional view of a pixel unit 800 of an image sensor in accordance with some embodiments of the present disclosure, and FIG. 8B is a schematic top view of the pixel unit 800 of an image sensor in accordance with some embodiments of the present disclosure. The pixel unit 800 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 800 includes a light-sensitive element 810, a protection layer 820, a gate dielectric layer 830, a conductive layer 840, a post structure 850 and a floating node 860. In some embodiments, the light-sensitive element 810 is a photodiode including doped regions 812 and 814. The doped regions 812 and 814 are formed by doping with a dopant of a first type. In some embodiment, the doped regions 812 and 814 are formed by doping with an n-type dopant. In some embodiments, the doped region 812 is doped at a first concentration, and the doped region 814 is doped at a second concentration greater than the first concentration. In some embodiments, the doped region 812 is doped at a concentration of about 1E12 atoms/cm$^3$, and the doped region 814 is doped at a concentration of about 5E12 atoms/cm$^3$, but embodiments of the present disclosure are not limited thereto.

The protection layer 820 is disposed on the light-sensitive element 810 to stabilize the light-sensitive element 810. The protection layer 820 may be referred to as a pinning layer and formed by doping with a dopant of a second type opposite to the first type. In some embodiments, the protection layer 820 is formed by doping with a p-type dopant at a concentration of about 1E13 atoms/cm$^3$.

In some embodiments, a doped region 870 is disposed on the light-sensitive element 810, and the doped region 770 is formed by doping with a dopant of the first type. In some embodiments, the doped region 870 is formed by doping with the n-type dopant at a concentration of about 2.5E12 atoms/cm$^3$.

The gate dielectric layer 830 and the conductive layer 840 are sequentially disposed on the doped region 870, thereby forming a vertical gate structure on the light-sensitive element 810. In some embodiments, the gate dielectric layer 830 and the conductive layer 840 are disposed on at least one sidewall of the post structure 850. In some embodiments, the gate dielectric layer 830 and the conductive layer 840 are disposed on all sidewalls of the post structure 850. In other words, the gate dielectric layer 830 and the conductive layer 840 cover and surround the post structure 850 as shown in FIG. 8B.

In some embodiments, the gate dielectric layer 830 is formed by high-k dielectric material. The high-k material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 840 is formed by doped poly-silicon, metal such as Al, Cu, W, Ti, Ta, TiN, TaN, NiSi, CoSi, other suitable conductive materials, or combinations thereof.

The post structure 850 can be formed from a semiconductor substrate. The semiconductor substrate may be a semiconductor material and may include structures including a graded layer or a buried oxide, for example. In some exemplary examples, the semiconductor substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate. Alternatively, the semiconductor substrate may be an active layer of a semiconductor-on-insulator (SOI) substrate or a multi-layered structure such as a silicon-germanium layer formed on a bulk silicon layer.

The floating node 860 is disposed on the post structure 850 and can be considered as a source node. In some embodiments, the pixel unit 800 further includes a source contact 882 and a gate contact 884 disposed on the floating node 860 and the conductive layer 840.

Therefore, when the vertical gate structure is turned on to transfer electrical signals outputted from the light-sensitive element 810 to a corresponding peripheral circuit, a vertical channel is induced in the post structure 850 to transfer the electrical signals of the light-sensitive element 810. Since the channel induced by the vertical gate structure is not located in a substrate in which the light-sensitive element 810 is formed, the light-sensitive element 810 can be formed to occupy a big area of the pixel unit 700, and high quantum efficiency (QE) is achieved.

In some embodiments, a doped region 872 is formed on the light-sensitive element 810 to benefit transmission of the electrical signals from the light-sensitive element 810, and the doped region 872 is formed by doping with a dopant of the first type. In some embodiments, the doped region 872 is formed by doping with the n-type dopant at a concentration of about 2.5E12 atoms/cm$^3$. In some embodiments, the doped region 872 occupies a portion a channel defined by the gate dielectric layer 830 and the conductive layer 840.

Further, in some embodiments, a doped region 874 is disposed on sidewalls of the post structure 850. The doped region 874 is located between the gate dielectric layer 830 and the floating node 860 and surrounds the post structure 850, thereby reducing capacitance of the gate dielectric layer 830. The doped region 874 is formed by doping with a dopant of the first type. In some embodiments, the doped region 874 is formed by doping with the n-type dopant at a concentration of about 1E12 atoms/cm$^3$. In some embodiments, the doped region 874 is omitted and the floating node 860 does not fully cover the top surface of the post structure 850 as shown in FIG. 8C.

It can be understood that an effective channel length of the transistor in the pixel unit 800 is defined in accordance with a height of the post structure 850. For example, as shown in FIG. 8A, an effective channel length ELA is defined between the doped region 874 and the doped region 872. With the increasing of a height 872h of the doped region 872, the effective channel length ELA becomes short, thus the effective channel length ELA is adjustable.

Figure 8C:
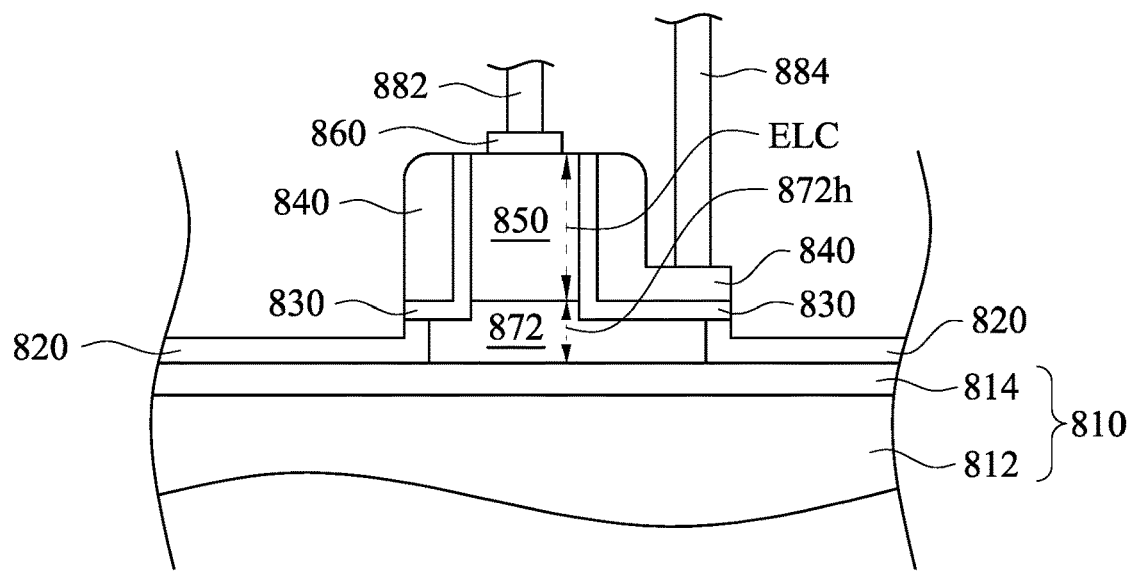
FIG. 8C is a schematic cross-sectional view of a pixel unit of an image sensor in accordance with some embodiments of the present disclosure.
Figure 8D:
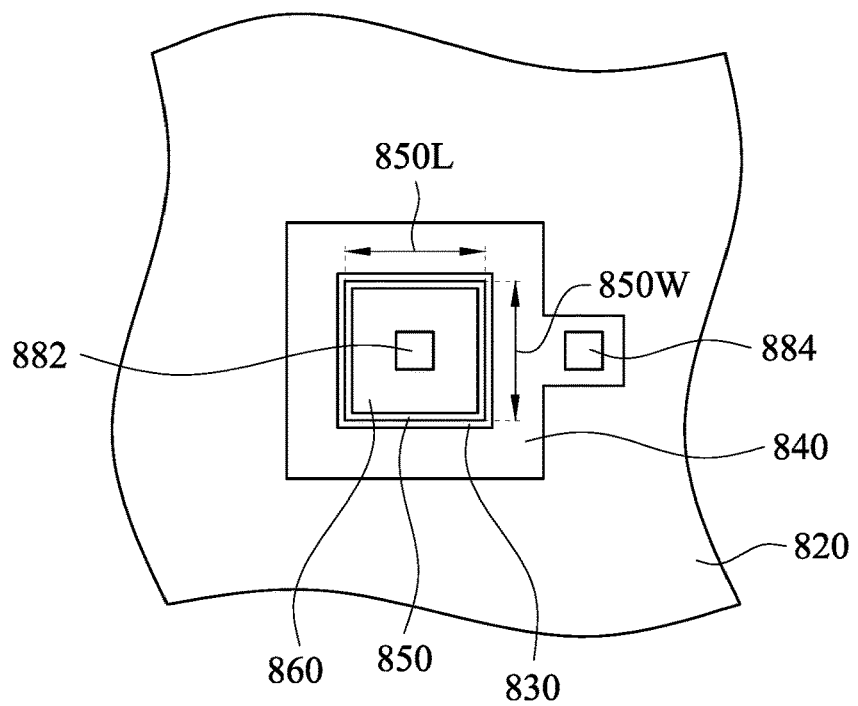
FIG. 8D is a schematic top view of the pixel unit of an image sensor in accordance with some embodiments of the present disclosure.
Figure 9:
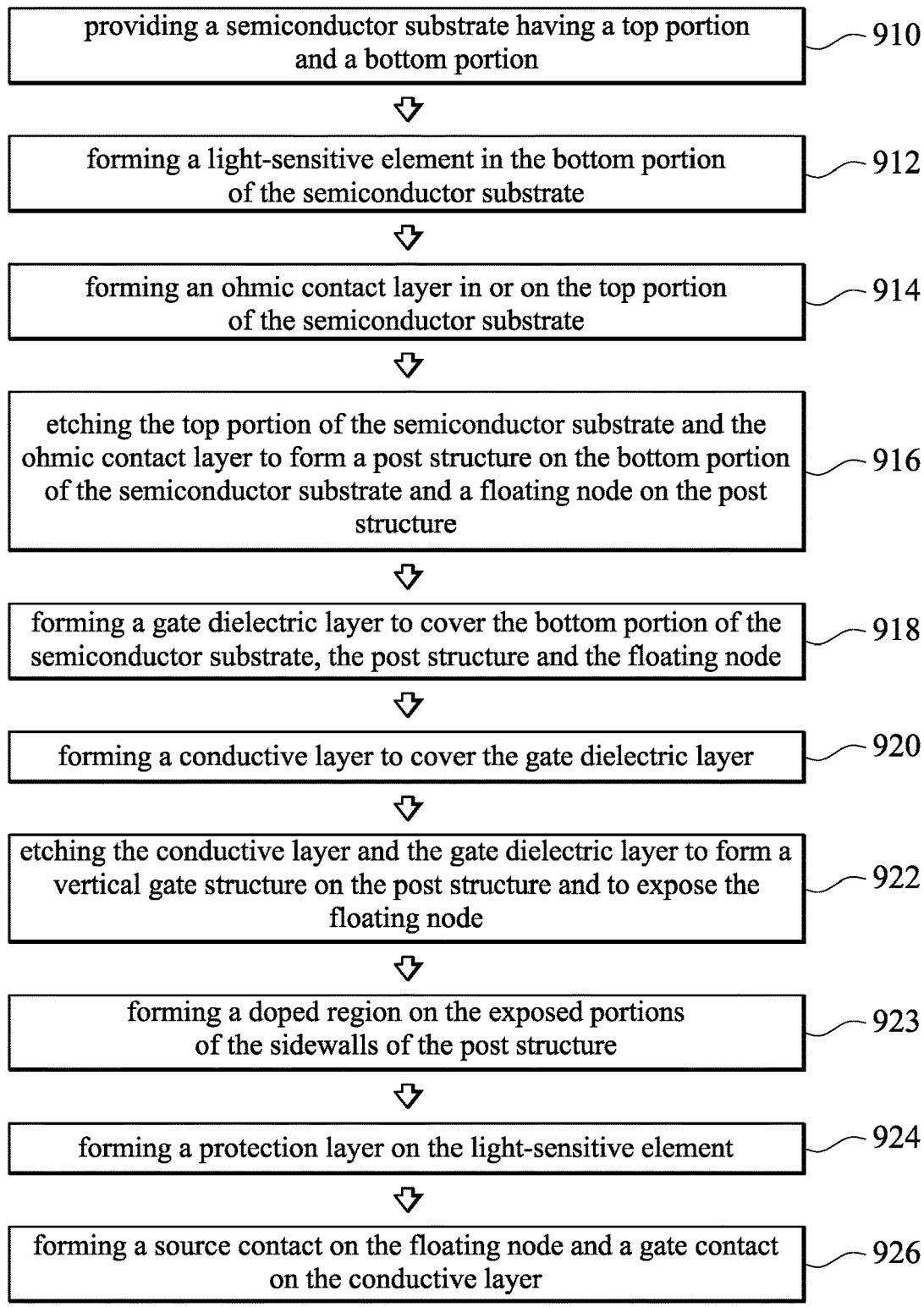
FIG. 9 is a flow chart showing a method for fabricating an image sensor in accordance with embodiments of the present disclosure.

For another example, as shown in FIG. 8C, an effective channel length ELC is defined by the doped region 872. With the increasing of a height 872h of the doped region 872, the effective channel length ELC becomes short, thus the effective channel length ELC is adjustable. Further, an effective channel width of the transistor in the pixel unit 800 is defined in accordance with a perimeter of the post structure 850. For example, as shown in FIG. 8D, the post structure 850 has a width 850W and a length 850L, and an effective channel width of the transistor is substantially equal to twice a value of a sum of the width 850W and the length 850L.

In the above embodiments, the post structure is in a shape of a rectangular column. However, embodiments of the present invention are not limited thereto. In some embodiments, the post structure is in a shape of a cylinder.

Figure 10A:
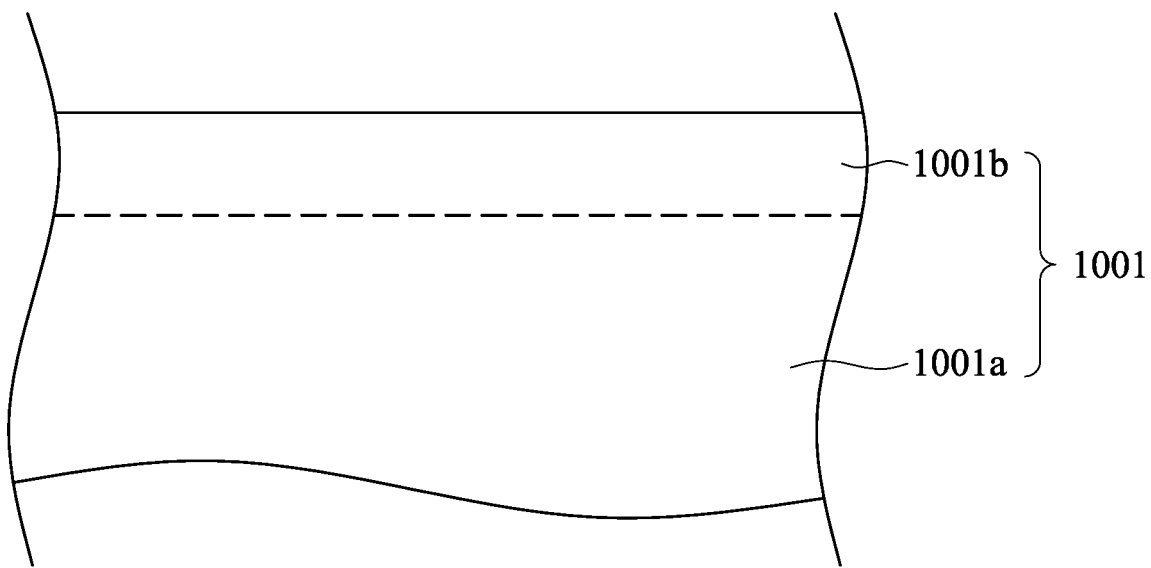
FIG. 10A to FIG. 10M are cross-sectional views of intermediate stages showing the method for fabricating an image sensor in accordance with some embodiments of the present disclosure.

Referring to FIG. 9 and FIG. 10A to FIG. 10J, FIG. 9 is a flow chart showing a method 900 for fabricating an image sensor in accordance with embodiments of the present disclosure, and FIG. 10A to FIG. 10J are cross-sectional views of intermediate stages showing the method 900 for fabricating an image sensor in accordance with some embodiments of the present disclosure. The method 900 begins at operation 910. Operation 910 is performed to provide a semiconductor substrate 1001 as shown in FIG. 10A. The semiconductor substrate 901 has a bottom portion 1001a and a top portion 1001b on the bottom portion 1001a.

In some embodiments, the semiconductor substrate 1001 may be a semiconductor material and may include structures including a graded layer or a buried oxide, for example. In some exemplary examples, the semiconductor substrate 901 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 1001. Alternatively, the semiconductor substrate 1001 may be an active layer of a semiconductor-on-insulator (SOI) substrate or a multi-layered structure such as a silicon-germanium layer formed on a bulk silicon layer.

Figure 10B:
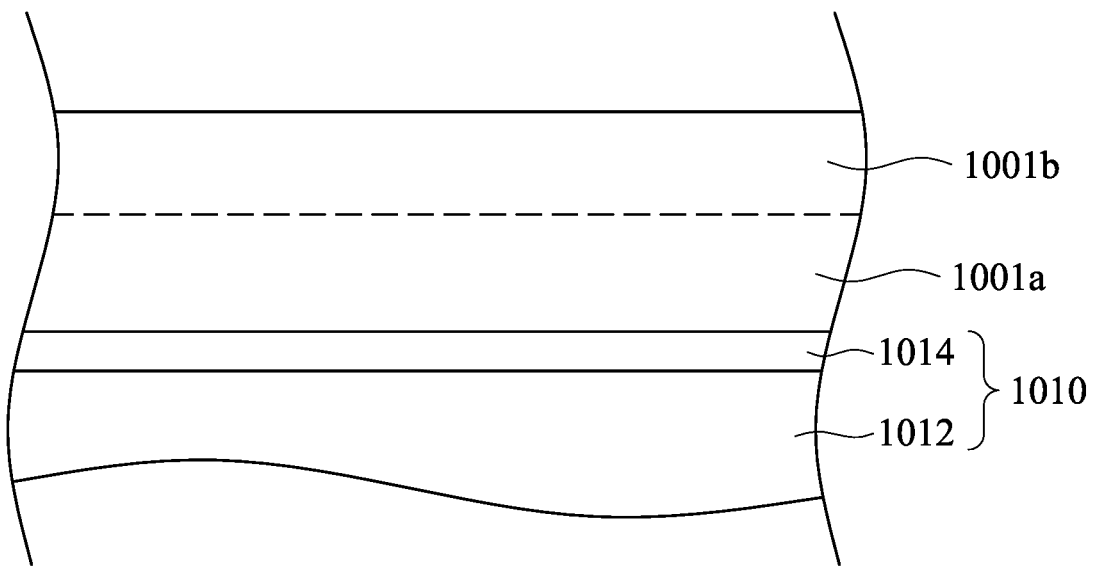

Then, operation 912 is performed to form a light-sensitive element 1010 in the bottom portion 1001a of the semiconductor substrate 1001 as shown in FIG. 10B. In some embodiments, the light-sensitive element 1010 is a photodiode and includes doped regions 1012 and 1014. The doped regions 1012 and 1014 are formed by doping with a dopant of a first type. In some embodiment, the doped regions 1012 and 1014 are formed by doping with an n-type dopant. In some embodiments, the doped region 1012 is doped at a first concentration, and the doped region 1014 is formed by doping with a second concentration greater than the first concentration. In some embodiments, the doped region 1012 is doped at a concentration of about 1E12 atoms/cm$^3$, and the doped region 1014 is doped at a concentration of about 5E12 atoms/cm$^3$, but embodiments of the present disclosure are not limited thereto.

Figure 10C:
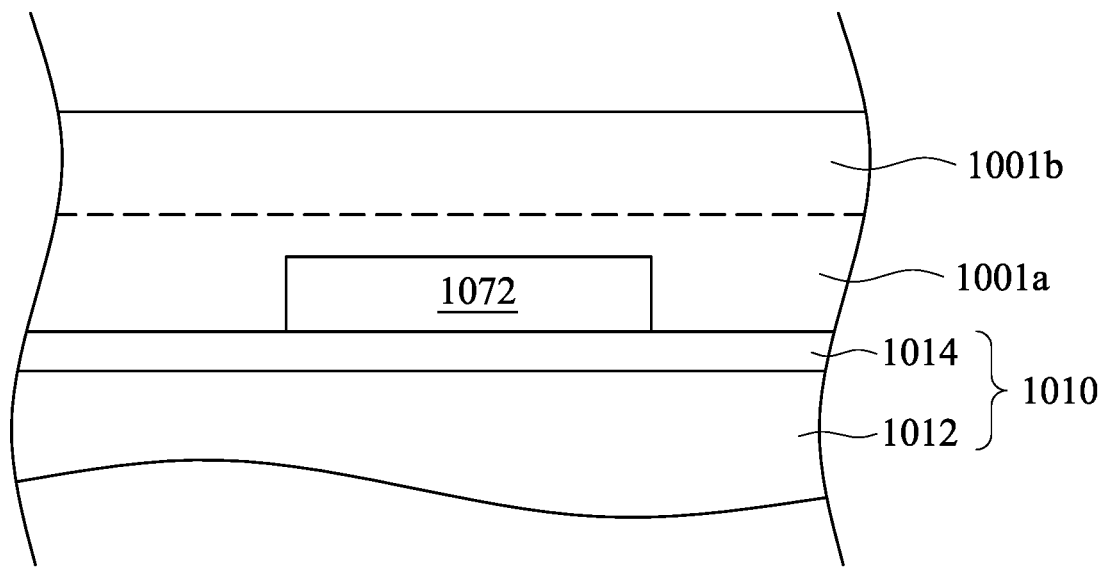

In some embodiments, a doped region 1072 can be formed on the light-sensitive element 1010 as shown in FIG. 10C, and the doped region 1072 is formed by doping with a dopant of the first type. In some embodiments, the doped region 1072 is formed by doping with the n-type dopant at a concentration of about 2.5E12 atoms/cm$^3$. In some embodiments, the doped region 1072 is not formed.

Figure 10D:
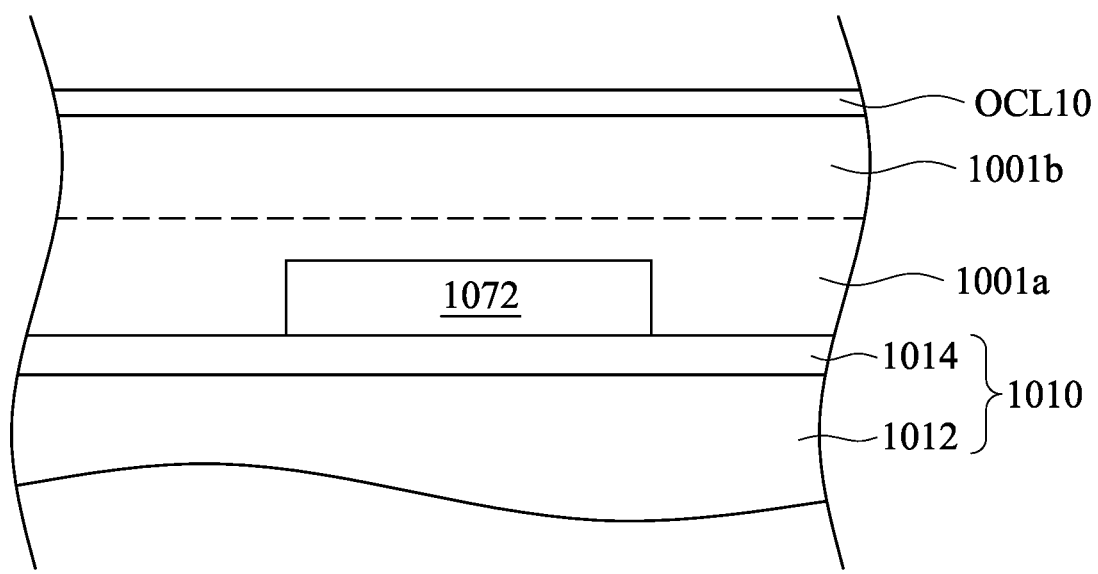

Thereafter, operation 914 is performed to form an ohmic contact layer OCL10 in or on the top portion 1001b of the semiconductor substrate 1001 as shown in FIG. 10D. In some embodiments, the ohmic contact layer OCL10 is formed by doping a portion of the top portion 1001b of the semiconductor substrate 1001. In some embodiments, a surface of the top portion 901b of the semiconductor substrate 1001 is formed by doping with the dopant of the first type at a concentration of 1E15 atoms/cm$^3$, but embodiments of the present disclosure are not limited thereto.

Figure 10E:
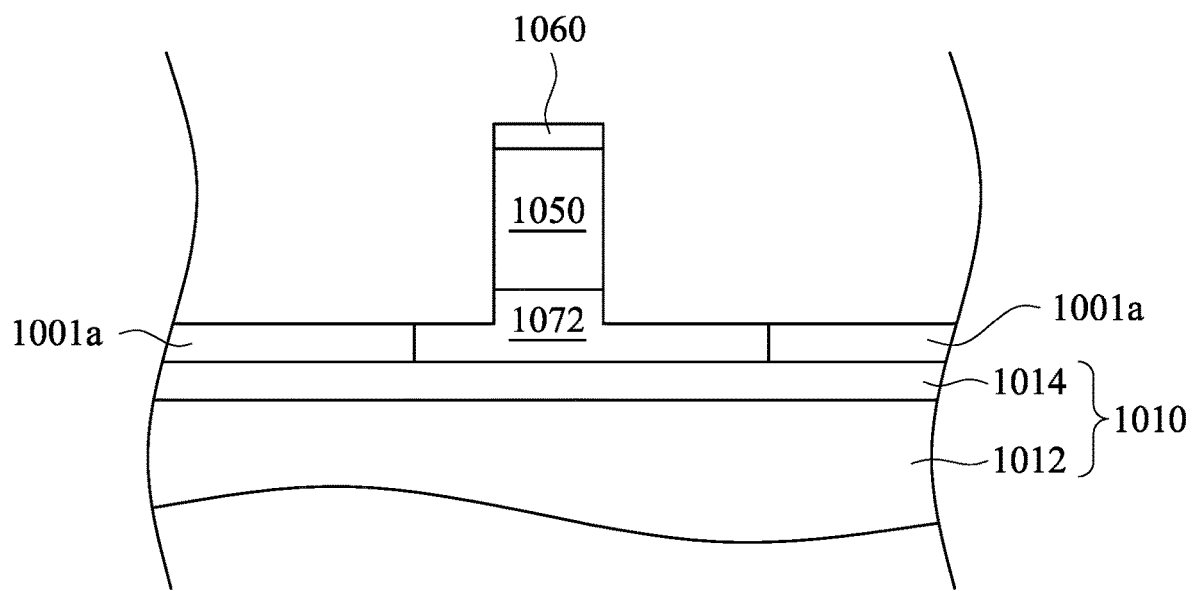

Then, operation 916 is performed to etch the top portion 1001b of the semiconductor substrate 1001 and the ohmic contact layer OCL10 to form a post structure 1050 on the bottom portion 1001a of the semiconductor substrate 1001 as shown in FIG. 10E. In operation 916, the top portion 1001b of the semiconductor substrate 1001 is etched to form at least one portion of the post structure 1050, and the ohmic contact layer OCL10 is etched to form a floating node 1060 on the post structure 1050. In some embodiments, a portion of the bottom portion 1001a of the semiconductor substrate 1001 is also etched to form another portion of the post structure 1050. In some embodiments, the doped region 1072 is etched to have a protrusion portion located under the post structure 1050.

Figure 10F:
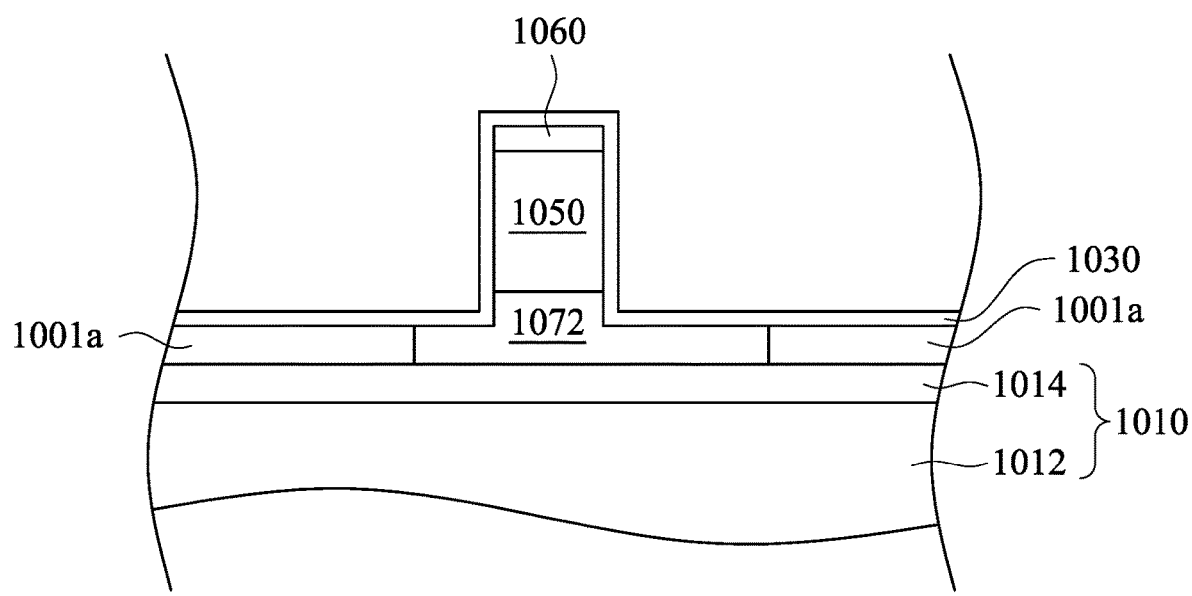

Thereafter, operation 918 is performed to blanketly forming a gate dielectric layer 1030 to cover the bottom portion 1001a of the semiconductor substrate 901, the post structure 1050 and the floating node 1060 as shown in FIG. 10F. In some embodiments, the gate dielectric layer 1030 is formed by using a deposition process such as an atomic layer deposition (ALD). Other methods to form the gate dielectric layer 1030 include chemical vapor deposition (CVD), physical vapor deposition (PVD), and plasma enhanced chemical vapor deposition (PECVD).

In some embodiments, the gate dielectric layer 1030 is formed by high-k dielectric material. The high-k material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Figure 10G:
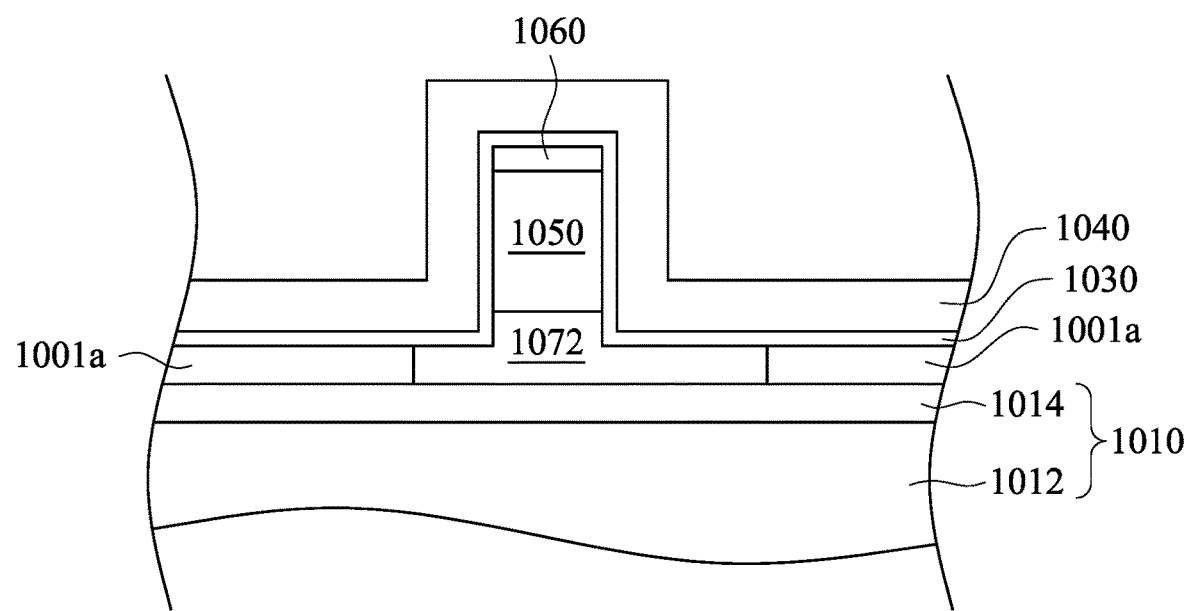

Then, operation 920 is performed to blanketly form a conductive layer 1040 to cover the gate dielectric layer 1030 as shown in FIG. 10G. In some embodiments, the conductive layer 1040 is formed by using a deposition process such as an atomic layer deposition (ALD). Other methods to form the conductive layer 1040 include chemical vapor deposition (CVD), physical vapor deposition (PVD), and plasma enhanced chemical vapor deposition (PECVD). In some embodiments, the conductive layer 1040 is formed by doped poly-silicon, metal such as Al, Cu, W, Ti, Ta, TiN, TaN, NiSi, CoSi, other suitable conductive materials, or combinations thereof.

Figure 10H:
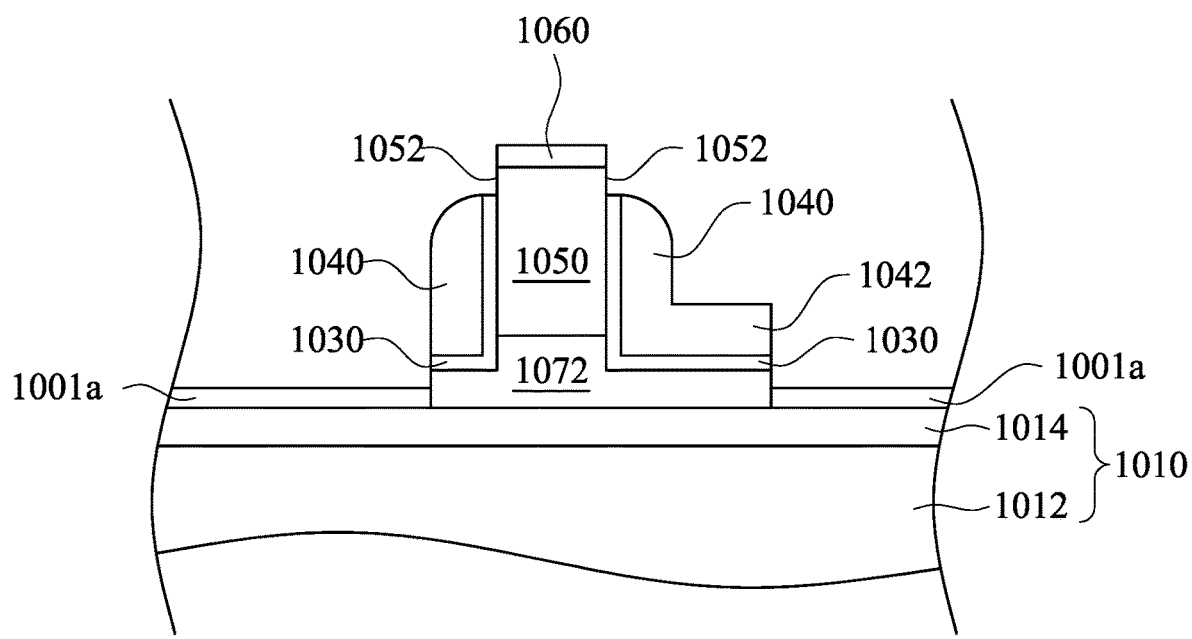

Thereafter, operation 922 is performed to etch the conductive layer 1040 and the gate dielectric layer 1030 to form a vertical gate structure on the post structure 1050 and to expose the floating node 1060 as shown in FIG. 10H. In some embodiments, the conductive layer 1040 is etched to form a contact landing portion 1042. In some embodiments, a portion of the bottom portion 1001a of the semiconductor substrate 1001 may be etched, and thus a portion of the doped region 1072 is exposed.

Figure 10I:
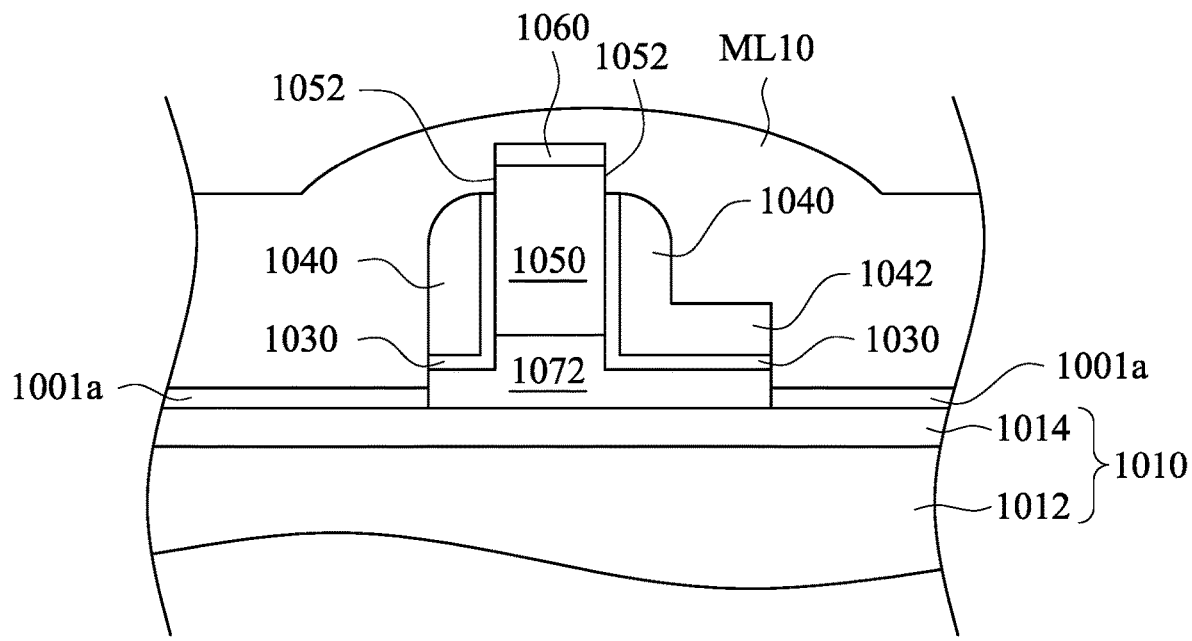
Figure 10J:
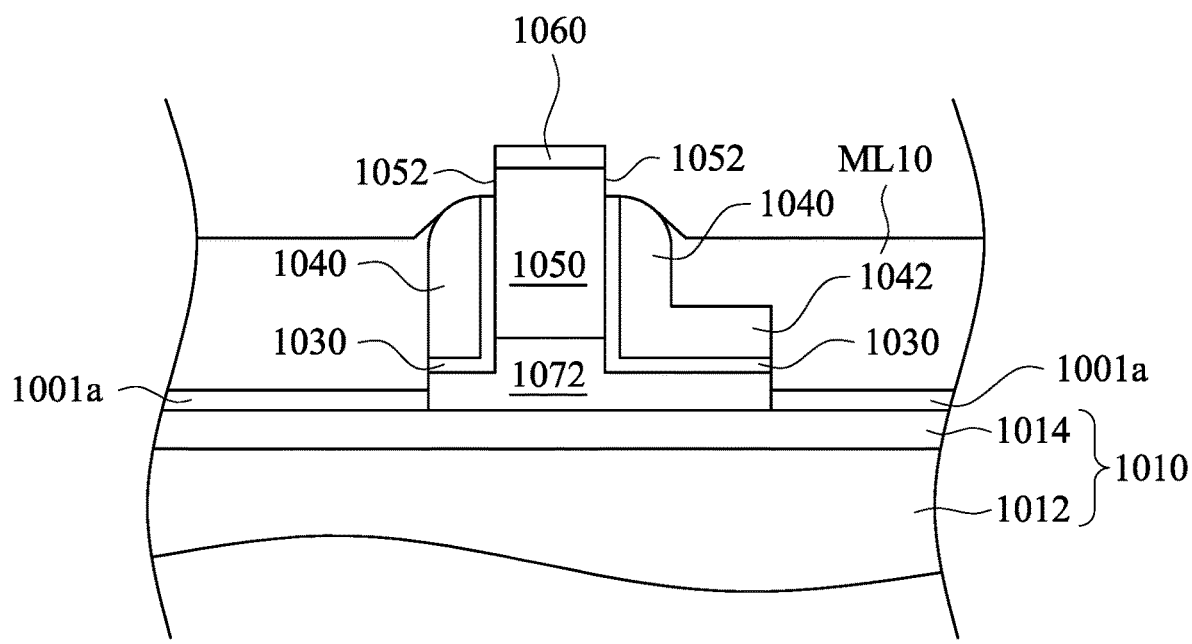
Figure 10K:
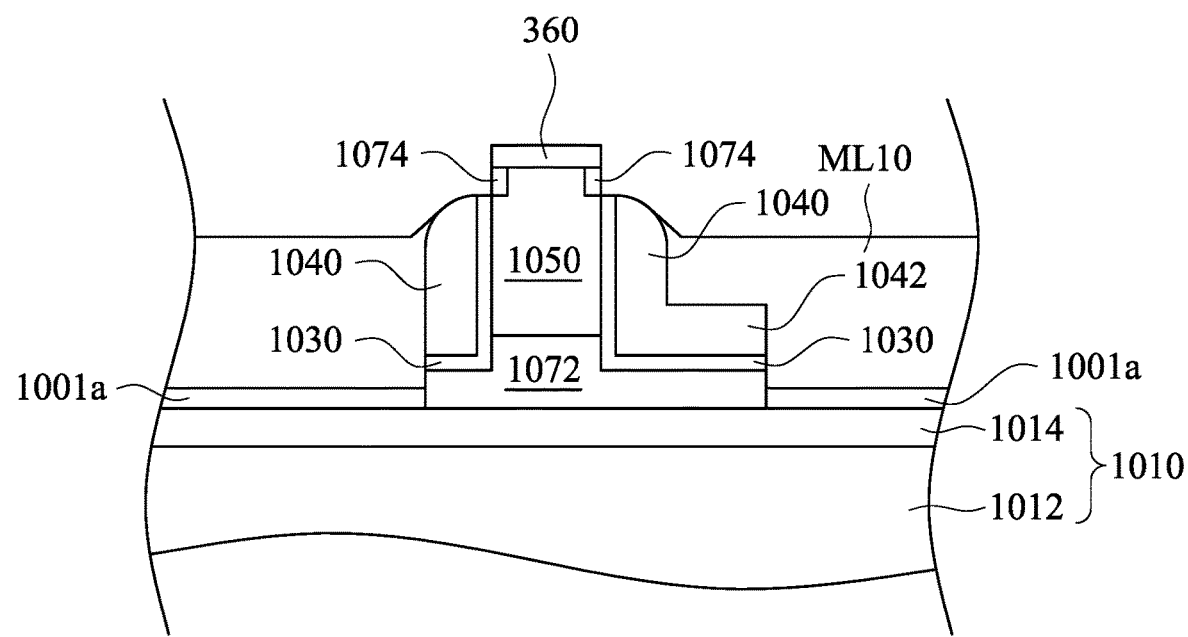

Then, operation 923 is performed to form a doped region on the exposed portions 1052 of the sidewalls of the post structure 1050 as shown in FIG. 10I, FIG. 10J and FIG. 10K. In the operation 923, at first, a mask layer ML10 is formed to cover the floating node 1060, the portions 1052 of the post structure 1050, the gate dielectric layer 1030, the conductive layer 1040 and the bottom portion 901a of the semiconductor substrate 1001, as shown in FIG. 10I. Then, the mask ML10 is etched to expose the portions 1052 of the post structure 1050 as shown in FIG. 10J. Thereafter, the portions 1052 of the post structure 1050 are doped to form a doped region 1074 surrounding the post structure 1050 as shown in FIG. 10K. In some embodiments, the portions 1052 of the post structure 1050 are doped with the n-type dopant at a concentration of about 1E12 atoms/cm$^3$. In some embodiments, the portions 1052 of the post structure 1050 are doped with a tilt angle.

Figure 10L:
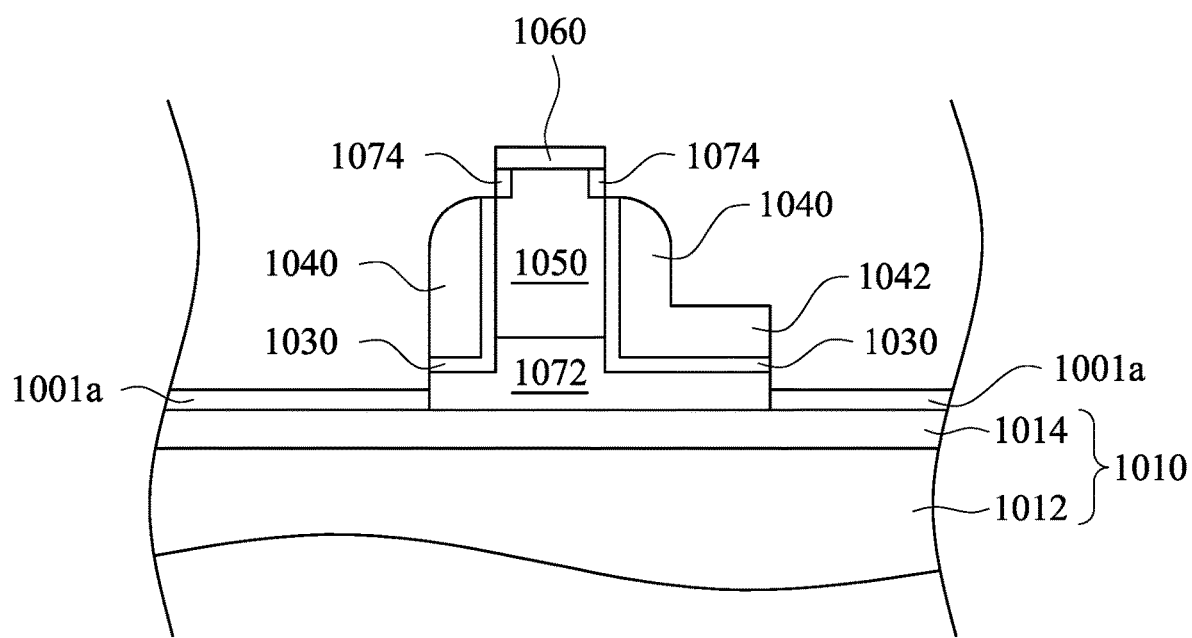

Then, operation 924 is performed to form a protection layer 1020 on the light-sensitive element 1010 as shown in FIG. 10L. The protection layer 1020 may be referred to as a pinning layer and formed by doping the bottom portion 1001a of the semiconductor substrate 1001 and the exposed portion of the doped region 1072. The protection layer 1020 is formed by doping with a dopant of a second type opposite to the first type. In some embodiments, the protection layer 1020 is formed by doping with a p-type dopant at a concentration of about 1E13 atoms/cm$^3$.

Figure 10M:
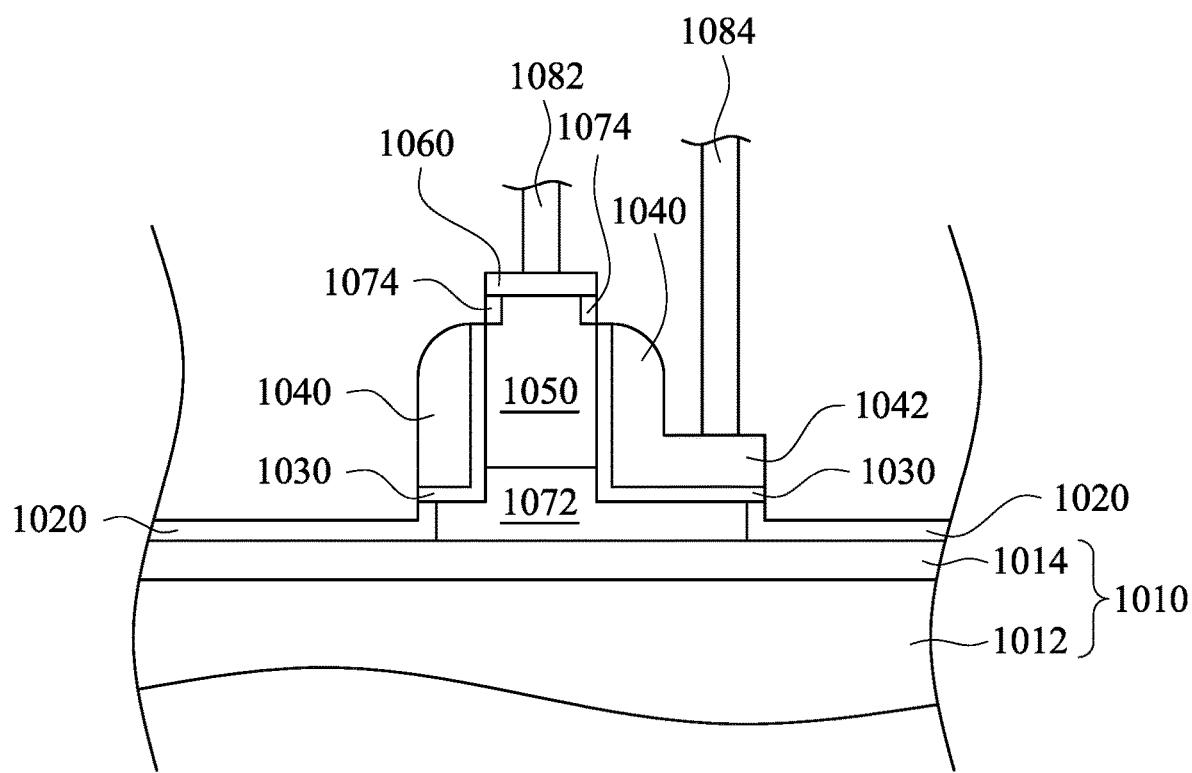

Thereafter, operation 926 is performed to form a source contact 1082 on the floating node 1060, and to form a gate contact 1084 on the gate contact landing portion 1042 of the conductive layer 1040, thereby forming a pixel unit 1000 as shown in FIG. 10M.

It can be understood that few masks are used in method 900 for fabricating an image sensor. For example, a mask is used to form the doped region 1072 as shown in FIG. 10C. For another example, a mask is used to achieve etching the top portion 1001b of the semiconductor substrate 1001 and the ohmic contact layer OCL10 as shown in FIG. 10E. For further another example, a mask is used to define the contact landing portion 1042 as shown in FIG. 10H. Since few masks are used in the method 900 for fabricating an image sensor, cost of the method 900 is reduced. Further, the method 900 adopts self-align methodology, and thus process window of operation of the method 900 can be enlarged.

In some embodiments, the operation 922 can be performed to enable the conductive layer 1040 and the gate dielectric layer 1030 to fully cover the post structure 1050, and operation 1023 is omitted. Therefore, no doped region is formed between the gate dielectric layer 1030 and the floating node 1060.

In addition, the floating node 1060 can be formed to have a smaller area to expose a portion of the post structure 1050 between the floating node 1060 and the gate dielectric layer 1030.

Figure 11A:
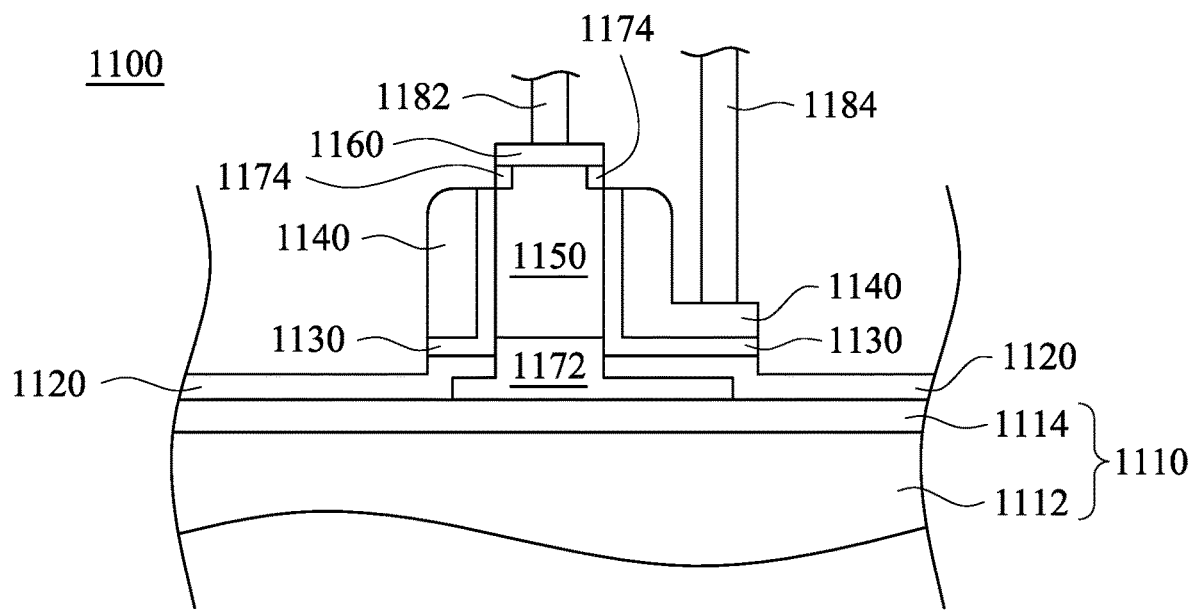
FIG. 11A is a schematic cross-sectional view of a pixel unit of an image sensor in accordance with some embodiments of the present disclosure.
Figure 11B:
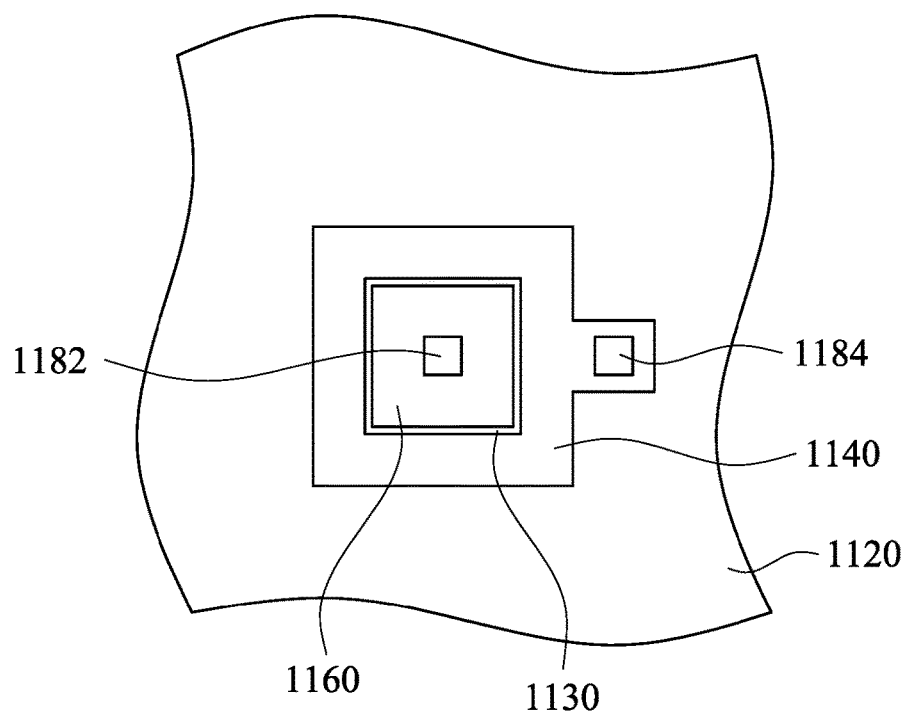
FIG. 11B is a schematic top view of the pixel unit of an image sensor in accordance with some embodiments of the present disclosure.

Referring to FIG. 11A and FIG. 11B, FIG. 11A is a schematic cross-sectional view of a pixel unit 1100 of an image sensor in accordance with some embodiments of the present disclosure, and FIG. 11B is a schematic top view of the pixel unit 1100 of an image sensor in accordance with some embodiments of the present disclosure. The pixel unit 1100 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1100 includes a light-sensitive element 1110, a protection layer 1120, a gate dielectric layer 1130, a conductive layer 1140, a post structure 1150 and a floating node 1160. In some embodiments, the light-sensitive element 1110 is a photodiode including doped regions 1112 and 1114. The doped regions 1112 and 1114 are formed by doping with a dopant of a first type. In some embodiment, the doped regions 1112 and 1114 are formed by doping with an n-type dopant. In some embodiments, the doped region 1112 is doped at a first concentration, and the doped region 1114 is doped at a second concentration greater than the first concentration. In some embodiments, the doped region 1112 is doped at a concentration of about 1E12 atoms/cm$^3$, and the doped region 1114 is doped at a concentration of about 5E12 atoms/cm$^3$, but embodiments of the present disclosure are not limited thereto.

The protection layer 1120 is disposed on the light-sensitive element 1110 to stabilize the light-sensitive element 1110. The protection layer 1120 may be referred to as a pinning layer and formed by doping with a dopant of a second type opposite to the first type. In some embodiments, the protection layer 1120 is formed by doping with a p-type dopant at a concentration of about 1E13 atoms/cm$^3$.

The gate dielectric layer 1130 and the conductive layer 1140 are sequentially disposed on the light-sensitive element 1110 and surround the post structure 1150, thereby forming a vertical gate structure on the light-sensitive element 1110. In some embodiments, the gate dielectric layer 1130 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 440 is formed by doped poly-silicon, metal such as Al, Cu, W, Ti, Ta, TiN, TaN, NiSi, CoSi, other suitable conductive materials, or combinations thereof.

The post structure 1150 can be formed from a semiconductor substrate. The semiconductor substrate may be a semiconductor material and may include structures including a graded layer or a buried oxide, for example. In some exemplary examples, the semiconductor substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate. Alternatively, the semiconductor substrate may be an active layer of a semiconductor-on-insulator (SOI) substrate or a multi-layered structure such as a silicon-germanium layer formed on a bulk silicon layer.

The floating node 1160 is formed on the post structure 1150 and can be considered as a source node. In some embodiments, the pixel unit 1100 further includes a source contact 1182 and a gate contact 1184 formed on the floating node 1160 and the conductive layer 1140.

Therefore, when the vertical gate structure is turned on to transfer signals generated by the light-sensitive element 1110 to corresponding peripheral circuits, a vertical channel is induced in the post structure 1150 to transfer the signals of the light-sensitive element 1110. Since the channel induced by the vertical gate structure is not located in a substrate in which the light-sensitive element 1110 is formed, the light-sensitive element 1110 can be formed to occupy a big area of the pixel unit 1100, and high quantum efficiency (QE) is achieved.

In some embodiments, a doped region 1172 is formed on the light-sensitive element 1110 and a portion of the protection layer 1120 is formed on the doped region 1172. The doped region 1172 is formed by doping with a dopant of the first type. In some embodiments, the doped region 1172 is formed by doping with the n-type dopant at a concentration of about 2.5E12 atoms/cm$^3$.

Figure 11C:
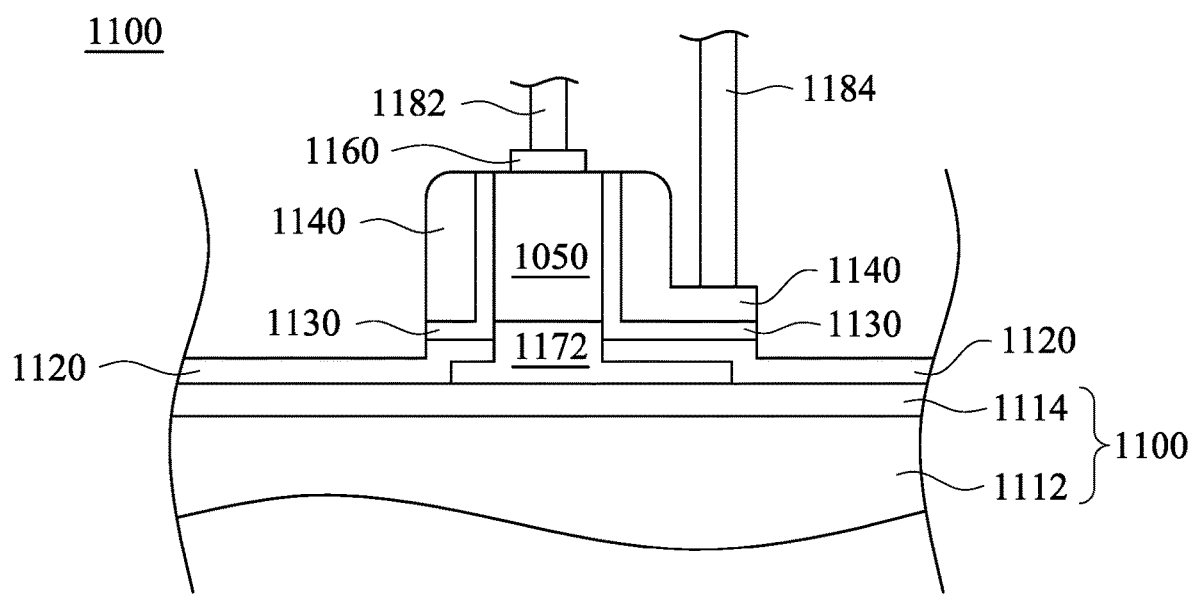
FIG. 11C is a schematic cross-sectional view of a pixel unit of an image sensor in accordance with some embodiments of the present disclosure.

Further, in some embodiments, a doped region 1174 is disposed on sidewalls of the post structure 1150. The doped region 1174 is located between the gate dielectric layer 1130 and the floating node 1160 and surrounds the post structure 1150, thereby reducing capacitance of the gate dielectric layer 1130. The doped region 1174 is formed by doping with a dopant of the first type. In some embodiments, the doped region 1174 is formed by doping with the n-type dopant at a concentration of about 1E12 atoms/cm$^3$. In some embodiments, the doped region 1174 is omitted and the floating node 1160 does not fully cover the top surface of the post structure 1150 as shown in FIG. 11C.

Figure 12A:
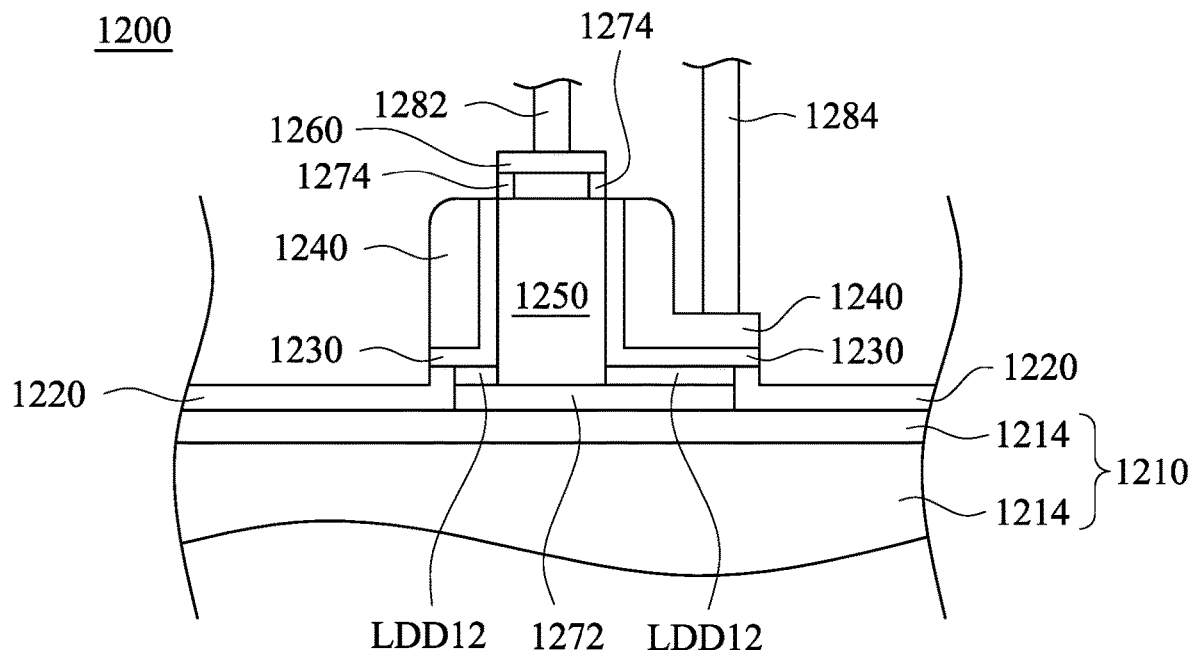
FIG. 12A is a schematic cross-sectional view of a pixel unit of an image sensor in accordance with some embodiments of the present disclosure.
Figure 12B:
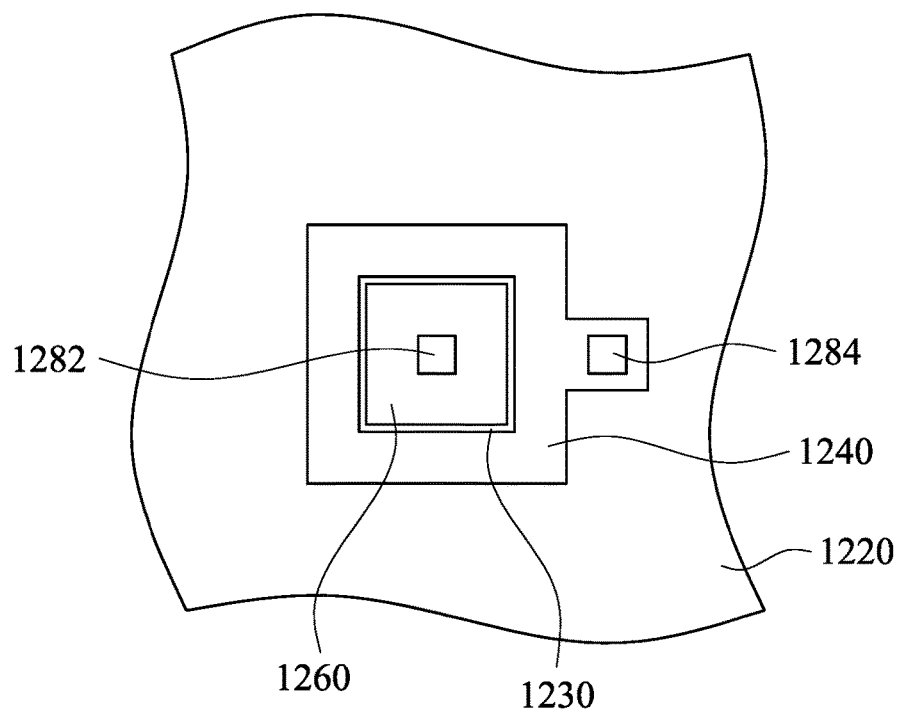
FIG. 12B is a schematic top view of the pixel unit of an image sensor in accordance with some embodiments of the present disclosure.

Referring to FIG. 12A and FIG. 12B, FIG. 12A is a schematic cross-sectional view of a pixel unit 1200 of an image sensor in accordance with some embodiments of the present disclosure, and FIG. 12B is a schematic top view of the pixel unit 1200 of an image sensor in accordance with some embodiments of the present disclosure. The pixel unit 1200 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1200 includes a light-sensitive element 1210, a protection layer 1220, a gate dielectric layer 1230, a conductive layer 1240, a post structure 1250, a floating node 1260 and a lightly-doped region LDD12, In some embodiments, the light-sensitive element 1210 is a photodiode including doped regions 1212 and 1214. The doped regions 1212 and 1214 are formed by doping with a dopant of a first type. In some embodiment, the doped regions 1212 and 1214 are formed by doping with an n-type dopant. In some embodiments, the doped region 1212 is doped at a first concentration, and the doped region 1214 is doped at a second concentration greater than the first concentration. In some embodiments, the doped region 1212 is doped at a concentration of about 1E12 atoms/cm$^3$, and the doped region 1214 is doped at a concentration of about 5E12 atoms/cm$^3$, but embodiments of the present disclosure are not limited thereto.

The protection layer 1220 is disposed on the light-sensitive element 1210 to stabilize the light-sensitive element 1210. The protection layer 1220 may be referred to as a pinning layer and formed by doping with a dopant of a second type opposite to the first type. In some embodiments, the protection layer 1220 is formed by doping with a p-type dopant at a concentration of about 1E13 atoms/cm$^3$.

The lightly-doped region LDD12 is formed on the light-sensitive element 1210 and surrounds the post structure 1250. In some embodiments, the lightly-doped region LDD12 is formed by doping with a dopant of the first type. In some embodiments, the lightly-doped region LDD12 is formed by doping with the n-type dopant at a third concentration smaller than the second concentration. In some embodiment, the lightly-doped region LDD12 is doped at a concentration of about 1E12 atoms/cm$^3$.

The gate dielectric layer 1230 and the conductive layer 1240 are sequentially disposed on the lightly-doped region LDD12 and surround the post structure 1250, thereby forming a vertical gate structure on the light-sensitive element 1210. In some embodiments, the gate dielectric layer 1230 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$), or another suitable material. In some embodiments, the conductive layer 1240 is formed by doped poly-silicon, metal such as Al, Cu, W, Ti, Ta, TiN, TaN, NiSi, CoSi, other suitable conductive materials, or combinations thereof.

The post structure 1250 can be formed from a semiconductor substrate. The semiconductor substrate may be a semiconductor material and may include structures including a graded layer or a buried oxide, for example. In some exemplary examples, the semiconductor substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate. Alternatively, the semiconductor substrate may be an active layer of a semiconductor-on-insulator (SOI) substrate or a multi-layered structure such as a silicon-germanium layer formed on a bulk silicon layer.

The floating node 1260 is formed on the post structure 1250 and can be considered as a source node. In some embodiments, the pixel unit 1200 further includes a source contact 1282 and a gate contact 1284 formed on the floating node 1260 and the conductive layer 1240.

Therefore, when the vertical gate structure is turned on to transfer signals generated by the light-sensitive element 1210 to corresponding peripheral circuits, a vertical channel is induced in the post structure 1250 to transfer the signals of the light-sensitive element 1210. Since the channel induced by the vertical gate structure is not located in a substrate in which the light-sensitive element 1210 is formed, the light-sensitive element 1210 can be formed to occupy a big area of the pixel unit 1200, and high quantum efficiency (QE) is achieved.

In some embodiments, a doped region 1272 is formed on the light-sensitive element 1210, and the doped region 1272 is formed by doping with a dopant of the first type. In some embodiments, the doped region 1272 is formed by doping with the n-type dopant at a concentration of about 2.5E12 atoms/cm$^3$.

Figure 12C:
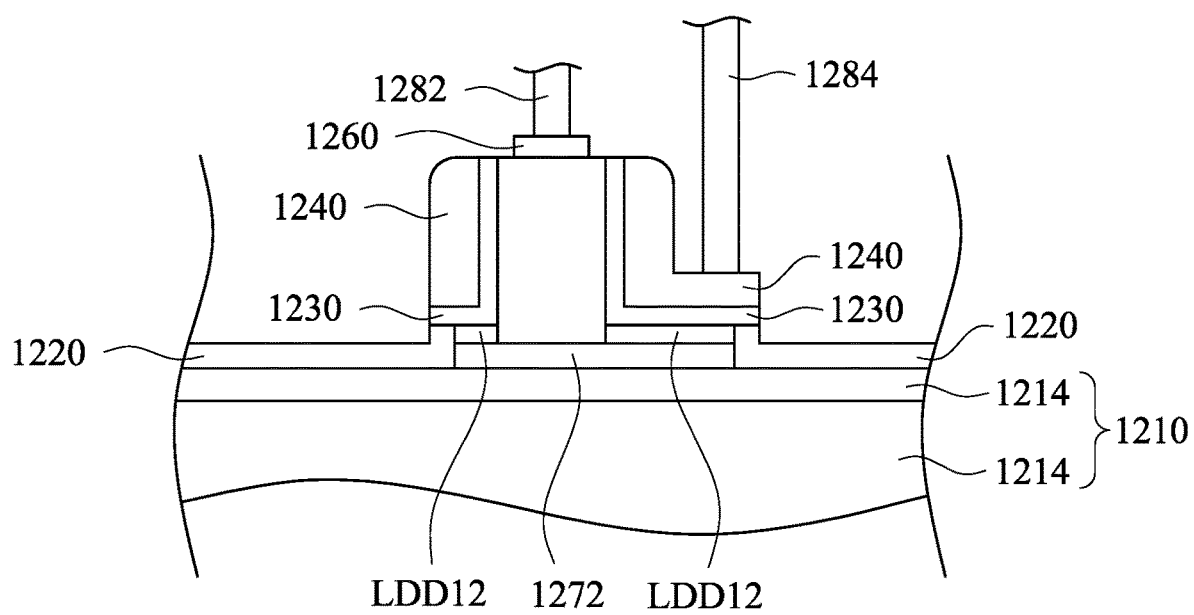
FIG. 12C is a schematic cross-sectional view of a pixel unit of an image sensor in accordance with some embodiments of the present disclosure.

Further, in some embodiments, a doped region 1274 is disposed on sidewalls of the post structure 1250. The doped region 1274 is located between the gate dielectric layer 1230 and the floating node 1260 and surrounds the post structure 1250, thereby reducing capacitance of the gate dielectric layer 1230. The doped region 1274 is formed by doping with a dopant of the first type. In some embodiments, the doped region 1274 is formed by doping with the n-type dopant at a concentration of about 1E12 atoms/cm$^3$. In some embodiments, the doped region 1274 is omitted and the floating node 1260 does not fully cover the top surface of the post structure 1250 as shown in FIG. 12C.

Figure 13A:
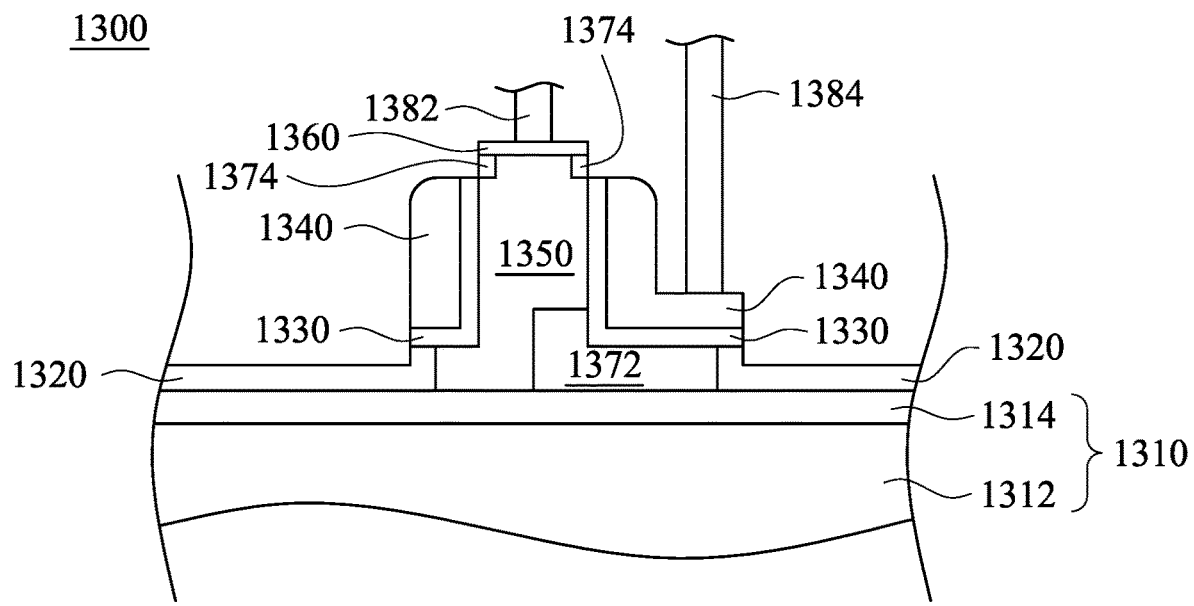
FIG. 13A is a schematic cross-sectional view of a pixel unit of an image sensor in accordance with some embodiments of the present disclosure.
Figure 13B:
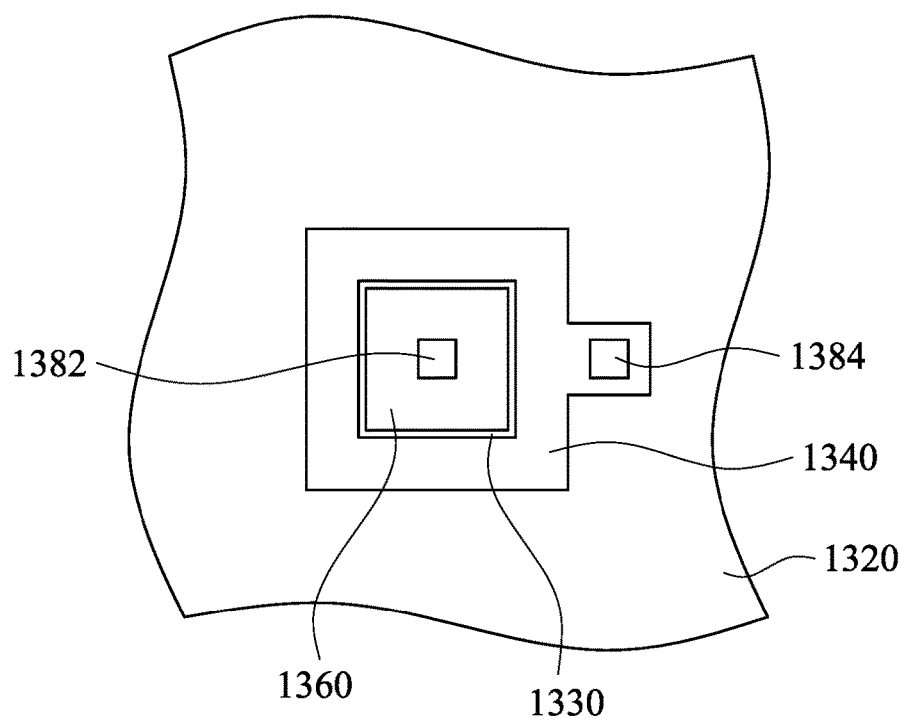
FIG. 13B is a schematic top view of the pixel unit of an image sensor in accordance with some embodiments of the present disclosure.

Referring to FIG. 13A and FIG. 13B, FIG. 13A is a schematic cross-sectional view of a pixel unit 1300 of an image sensor in accordance with some embodiments of the present disclosure, and FIG. 13B is a schematic top view of the pixel unit 1300 of an image sensor in accordance with some embodiments of the present disclosure. The pixel unit 1300 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1300 includes a light-sensitive element 1310, a protection layer 1320, a gate dielectric layer 1330, a conductive layer 1340, a post structure 1350 and a floating node 1360. In some embodiments, the light-sensitive element 1310 is a photodiode including doped regions 1312 and 1314. The doped regions 1312 and 1314 are formed by doping with a dopant of a first type. In some embodiment, the doped regions 1312 and 1314 are formed by doping with an n-type dopant. In some embodiments, the doped region 1312 is doped at a first concentration, and the doped region 1314 is doped at a second concentration greater than the first concentration. In some embodiments, the doped region 1312 is doped at a concentration of about 1E12 atoms/cm$^3$, and the doped region 1314 is doped at a concentration of about 5E12 atoms/cm$^3$, but embodiments of the present disclosure are not limited thereto.

The protection layer 1320 is disposed on the light-sensitive element 1310 to stabilize the light-sensitive element 1310. The protection layer 1320 may be referred to as a pinning layer and formed by doping with a dopant of a second type opposite to the first type. In some embodiments, the protection layer 1320 is formed by doping with a p-type dopant at a concentration of about 1E13 atoms/cm$^3$.

The gate dielectric layer 1330 and the conductive layer 1340 are sequentially disposed on the light-sensitive element 1310 and surround the post structure 1350, thereby forming a vertical gate structure on the light-sensitive element 1310. In some embodiments, the gate dielectric layer 1330 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 1040 is formed by doped poly-silicon, metal such as Al, Cu, W, Ti, Ta, TiN, TaN, NiSi, CoSi, other suitable conductive materials, or combinations thereof.

The post structure 1350 can be formed from a semiconductor substrate. The semiconductor substrate may be a semiconductor material and may include structures including a graded layer or a buried oxide, for example. In some exemplary examples, the semiconductor substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate. Alternatively, the semiconductor substrate may be an active layer of a semiconductor-on-insulator (SOI) substrate or a multi-layered structure such as a silicon-germanium layer formed on a bulk silicon layer.

The floating node 1360 is formed on the post structure 1350 and can be considered as a source node. In some embodiments, the pixel unit 1300 further includes a source contact 1382 and a gate contact 1384 formed on the floating node 1360 and the conductive layer 1340. Therefore, when the vertical gate structure is turned on to transfer signals generated by the light-sensitive element 1310 to corresponding peripheral circuits, a vertical channel is induced in the post structure 1350 to transfer the signals of the light-sensitive element 1310. Since the channel induced by the vertical gate structure is not located in a substrate in which the light-sensitive element 1310 is formed, the light-sensitive element 1310 can be formed to occupy a big area of the pixel unit 1300, and high quantum efficiency (QE) is achieved.

In some embodiments, a doped region 1372 is formed on the light-sensitive element 1310, and the doped region 1372 is formed by doping with a dopant of the first type. In some embodiments, the doped region 1372 is formed by doping with the n-type dopant at a concentration of about 2.5E12 atoms/cm$^3$. Comparing with the doped region 872 of the pixel unit 800, the doped region 1372 occupies a smaller area, and thus the post structure 1350 touches the light-sensitive element 1310 and the protection layer 1320. In some embodiments, a ground reference voltage is applied on the protection layer 1320, thereby enabling the arrangement of the doped region 1372 to benefit the benefit transmission of the electrical signals from the light-sensitive element 1310.

Figure 13C:
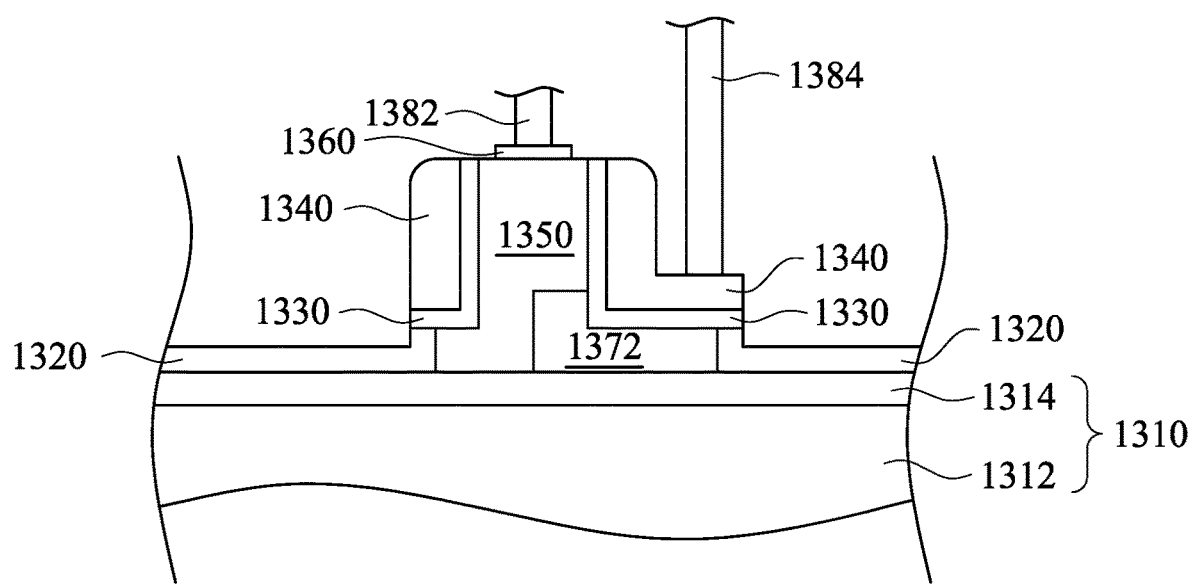
FIG. 13C is a schematic cross-sectional view of a pixel unit of an image sensor in accordance with some embodiments of the present disclosure.

Further, in some embodiments, a doped region 1374 is disposed on sidewalls of the post structure 1350. The doped region 1374 is located between the gate dielectric layer 1330 and the floating node 1360 and surrounds the post structure 1350, thereby reducing capacitance of the gate dielectric layer 1330. The doped region 1374 is formed by doping with a dopant of the first type. In some embodiments, the doped region 1374 is formed by doping with the n-type dopant at a concentration of about 1E12 atoms/cm$^3$. In some embodiments, the doped region 1374 is omitted and the floating node 1360 does not fully cover the top surface of the post structure 1350 as shown in FIG. 13C.

Figure 14A:
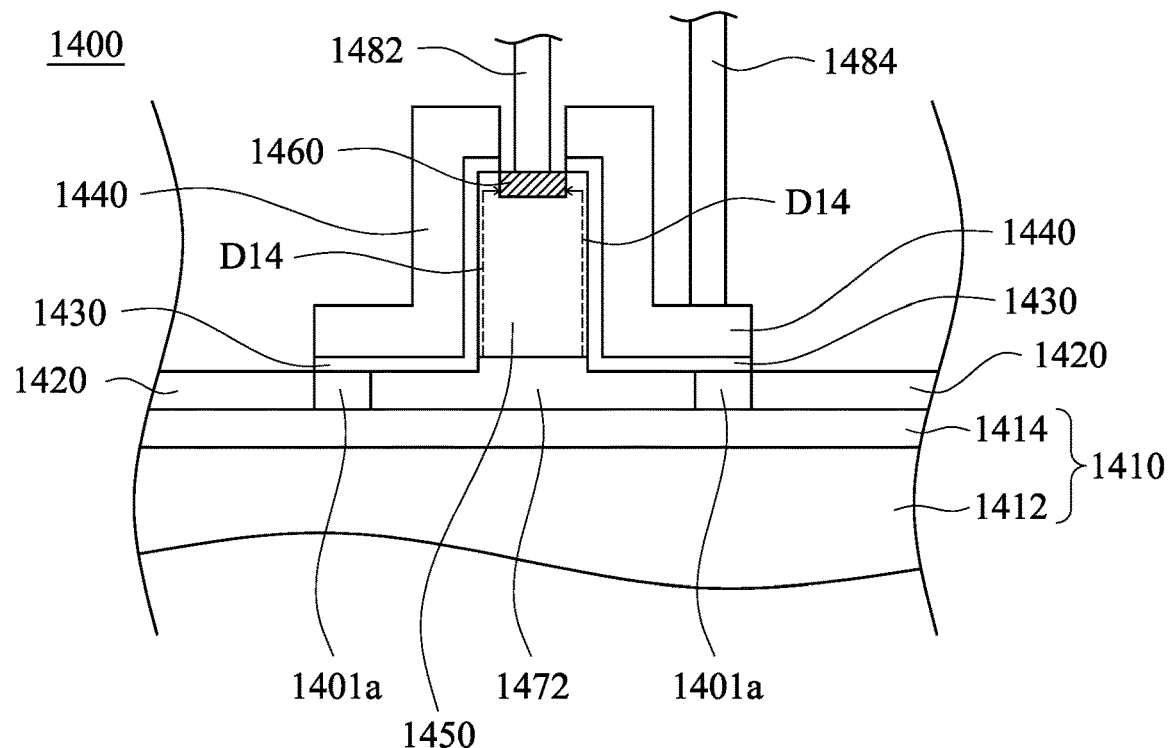
FIG. 14A is a schematic cross-sectional view of a pixel unit of an image sensor in accordance with some embodiments of the present disclosure.
Figure 14B:
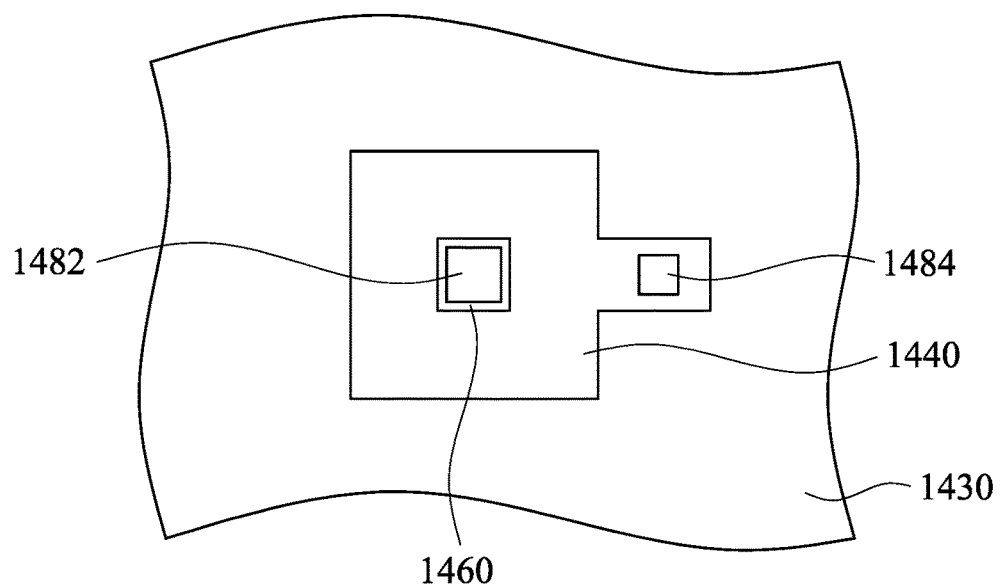
FIG. 14B is a schematic top view of the pixel unit of an image sensor in accordance with some embodiments of the present disclosure.

Referring to FIG. 14A and FIG. 14B, FIG. 14A is a schematic cross-sectional view of a pixel unit 1400 of an image sensor in accordance with some embodiments of the present disclosure, and FIG. 14B is a schematic top view of the pixel unit 1400 of an image sensor in accordance with some embodiments of the present disclosure. The pixel unit 1400 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1400 includes a light-sensitive element 1410, a protection layer 1420, a gate dielectric layer 1430, a conductive layer 1440, a post structure 1450 and a floating node 1460. In some embodiments, the light-sensitive element 1410 is a photodiode including doped regions 1412 and 1414. The doped regions 1412 and 1414 are formed by doping with a dopant of a first type. In some embodiment, the doped regions 1412 and 1414 are formed by doping with an n-type dopant. In some embodiments, the doped region 1412 is doped at a first concentration, and the doped region 1414 is doped at a second concentration greater than the first concentration. In some embodiments, the doped region 1412 is doped at a concentration of about 1E12 atoms/cm$^3$, and the doped region 1414 is doped at a concentration of about 5E12 atoms/cm$^3$, but embodiments of the present disclosure are not limited thereto.

The protection layer 1420 is disposed on the light-sensitive element 1410 to stabilize the light-sensitive element 1410. The protection layer 1420 may be referred to as a pinning layer and formed by doping with a dopant of a second type opposite to the first type. In some embodiments, the protection layer 1420 is formed by doping with a p-type dopant at a concentration of about 1E13 atoms/cm$^3$. In some embodiments, the protection layer 1420 is divided by plural semiconductor layers 1401*a*. In some embodiments, the semiconductor layers 1401*a* can be omitted.

The gate dielectric layer 1430 and the conductive layer 1440 are sequentially disposed on the light-sensitive element 1410 and surround the post structure 1450, thereby forming a vertical gate structure on the light-sensitive element 1410.

In some embodiments, portions of the gate dielectric layer 1430 and the conductive layer 1440 are disposed on the top surface of the post structure 1450. Further, in some embodiments, the gate dielectric layer 1430 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 1440 is formed by doped poly-silicon, metal such as Al, Cu, W, Ti, Ta, TiN, TaN, NiSi, CoSi, other suitable conductive materials, or combinations thereof.

The post structure 1450 can be formed from a semiconductor substrate. The semiconductor substrate may be a semiconductor material and may include structures including a graded layer or a buried oxide, for example. In some exemplary examples, the semiconductor substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate. Alternatively, the semiconductor substrate may be an active layer of a semiconductor-on-insulator (SOI) substrate or a multi-layered structure such as a silicon-germanium layer formed on a bulk silicon layer.

The floating node 1460 is formed on the post structure 1450 and can be considered as a source node. In some embodiments, the pixel unit 1400 further includes a source contact 1482 and a gate contact 1484 formed on the floating node 1460 and the conductive layer 1440.

Therefore, when the vertical gate structure is turned on to transfer signals generated by the light-sensitive element 1410 to corresponding peripheral circuits, a vertical channel is induced in the post structure 1450 to transfer the signals of the light-sensitive element 1410. Since the channel induced by the vertical gate structure is not located in a substrate in which the light-sensitive element 1410 is formed, the light-sensitive element 1410 can be formed to occupy a big area of the pixel unit 1400, and high quantum efficiency (QE) is achieved. In addition, the gate dielectric layer 1430 and the conductive layer 1440 includes portions disposed on the post structure 1450 and adjacent to the floating node, the signals of the light-sensitive element 1410 are transmitted to the peripheral circuits along the direction D14.

In some embodiments, a doped region 1472 is formed on the light-sensitive element 1410, and the doped region 1472 is formed by doping with a dopant of the first type. In some embodiments, the doped region 1472 is formed by doping with the n-type dopant at a concentration of about $2.5E12$ atoms/$cm^3$.

Figure 15:
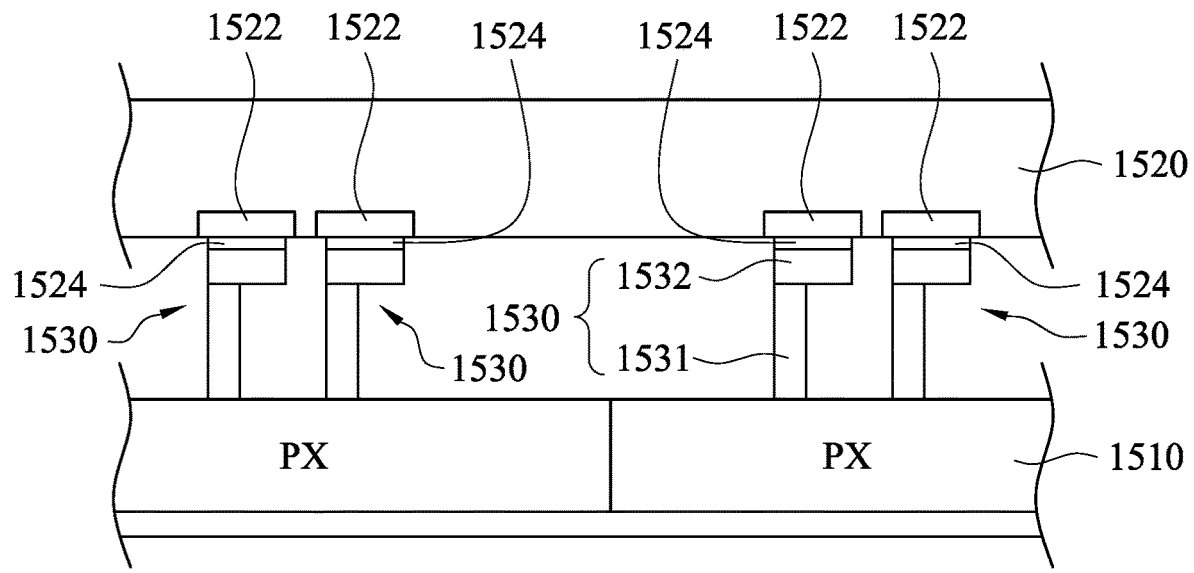
FIG. 15 is a schematic cross-sectional view of an image sensor in accordance with some embodiments of the present disclosure.
Figure 16:
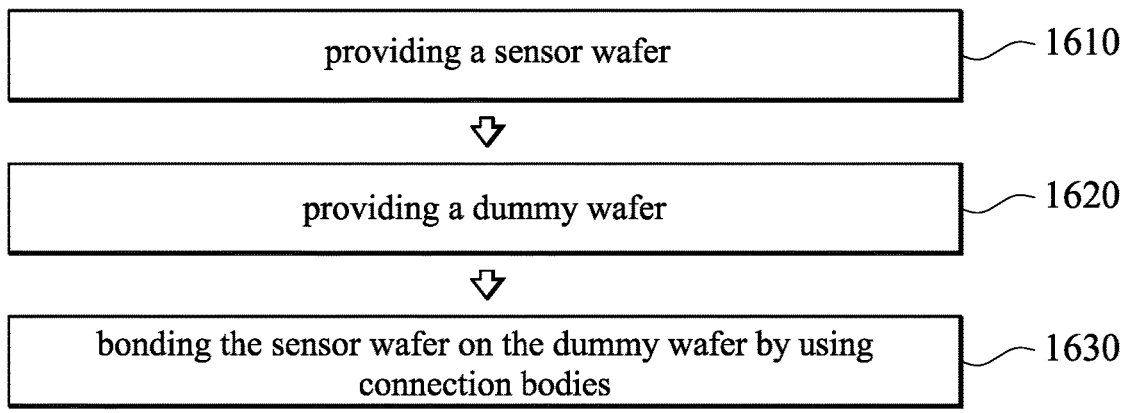
FIG. 16 is a flow chart showing a method for fabricating an image sensor in accordance with embodiments of the present disclosure.

Referring to FIG. 15, FIG. 15 is a schematic cross-sectional view of an image sensor 1500 in accordance with some embodiments of the present disclosure. The image sensor 1500 includes a sensor wafer 1510, a circuit wafer 1520 and plural connection members 1530. The sensor wafer 1510 includes plural pixel units PX configured to convert various photo energy of light into electrical signals.

In some embodiments, the above pixel unit 100, 200, 300, 400, 600, 700, 800, 1100, 1200, 1300 or 1400 is applied for each of the pixel units PX. The circuit wafer 1520 includes plural peripheral circuits 1522 corresponding to the pixel units PX and plural contacts 1524 of the peripheral circuits 1522. In some embodiments, the peripheral circuit 1522 may be an amplifier circuit (for example, a source follower circuit), a reset circuit and/or a selection circuit. The connection members 1530 are configured to electrically connect the pixel units PX of the sensor wafer 1510 to the peripheral circuits 1522 of the circuit wafer 1520, thereby achieving pixel level bonding. In some embodiments, each of the connection members 1530 includes a first portion 1531 and a second portion 1532. The second portion 1532 is wider than the first portion 1531, thereby enabling the connection members 1530 has a shape of funnel. In some embodiments, the first portion 1531 is located adjacent to the pixel unit PX in the sensor wafer 1510, and the second portion 1532 is located adjacent to a corresponding peripheral circuit 1522 in the sensor wafer circuit wafer 1520. In some embodiments, the first portion 1531 is disposed on the contact of the pixel unit PX (for example, the contact 182 of the pixel unit 100), and the second portion 1532 is disposed on the contact 1524, thereby connecting the pixel unit PX to the corresponding peripheral circuit 1522.

Further, since the peripheral circuits 1522 corresponding to the pixel units PX are formed in the circuit wafer 1520, fewer connection members are used to bond the sensor wafer 1510 on the circuit wafer 1520. Therefore, the pixel level bonding can be easily achieved.

Figure 17A:
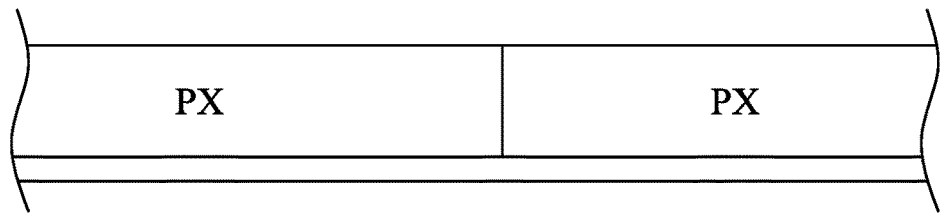
FIG. 17A to FIG. 17C are cross-sectional views of intermediate stages showing the method for fabricating an image sensor in accordance with some embodiments of the present disclosure.
Figure 17B:
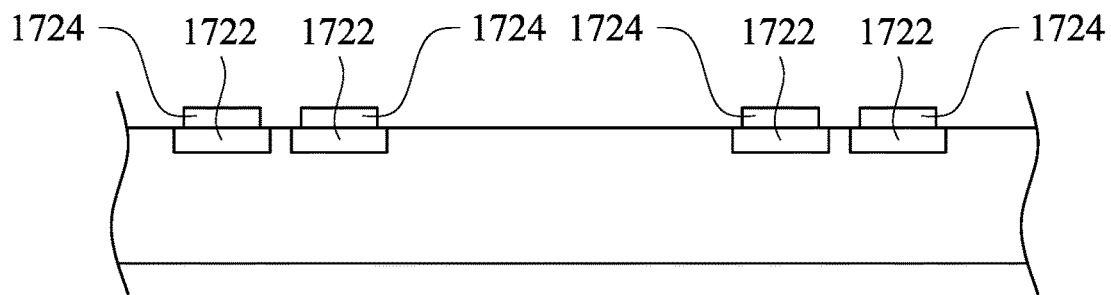
Figure 17C:
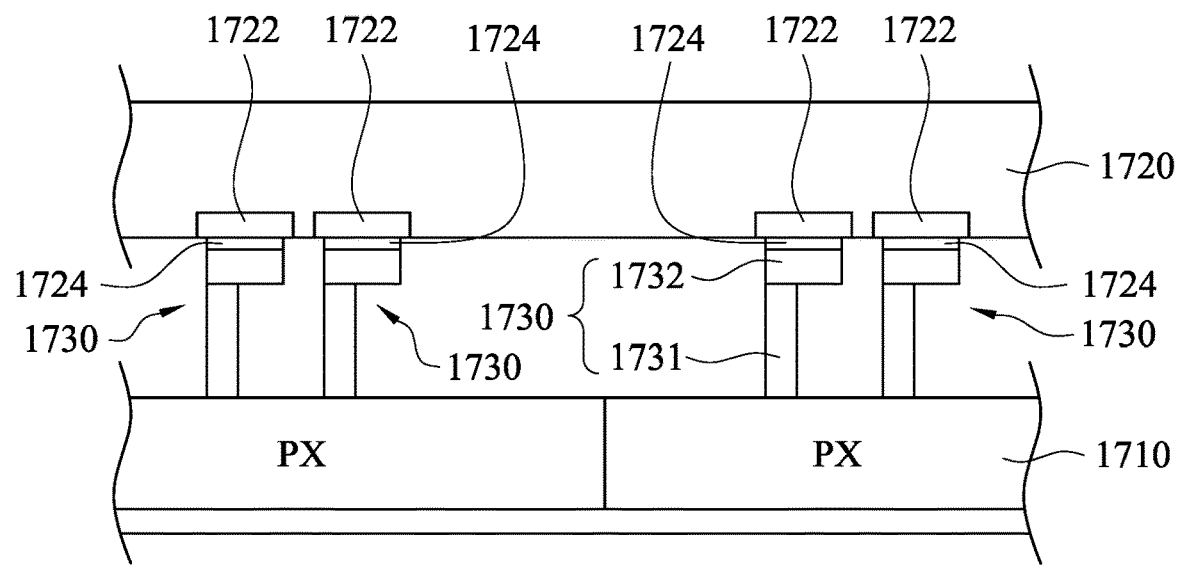

Referring to FIG. 16 and FIG. 17A to FIG. 17C, FIG. 16 is a flow chart showing a method 1600 for fabricating an image sensor in accordance with embodiments of the present disclosure, and FIG. 17A to FIG. 17C are cross-sectional views of intermediate stages showing the method 1600 for fabricating an image sensor in accordance with some embodiments of the present disclosure. The method 1600 begins at operation 1610. Operation 1610 is performed provide a sensor wafer 1710 including pixels PX as shown in FIG. 17A. In some embodiments, operation 1610 includes the method 900 or other suitable method for fabricating pixels of an image sensor. Then, operation 1620 is performed to provide a circuit wafer 1720 including plural peripheral circuits 1722 and contacts 1724 thereof, as shown in FIG. 17B. In some embodiments, the peripheral circuit 1722 may be an amplifier circuit (for example, a source follower circuit), a reset circuit and/or a selection circuit. Thereafter, operation 1630 is performed to bond the sensor wafer 1710 on the circuit wafer 1720 by using plural connection members 1730, as shown in FIG. 17C. In some embodiments, each of the connection members 1730 includes a first portion 1731 and a second portion 1732. The second portion 1732 is wider than the first portion 1731, thereby enabling the connection members 1730 has a shape of funnel. In some embodiments, the first portion 1731 is connected to a contact (for example, the contact 182 of the pixel unit 100) of a pixel unit PX, and the second portion 1732 is connected to the contact 1724 of a corresponding peripheral circuit 1722, thereby connecting the pixel unit PX to the corresponding peripheral circuit 1722.

Since the above pixel unit 100, 200, 300, 400, 600, 700, 800, 1100, 1200, 1300 or 1400 can be applied for each of the pixel units PX, and the peripheral circuits 1722 are disposed on the circuit wafer 1720, fewer connection members 1730 are used to connect the sensor wafer 1710 to the circuit wafer 1720, and a success rate for the pixel level bonding is increased.

Figure 18:
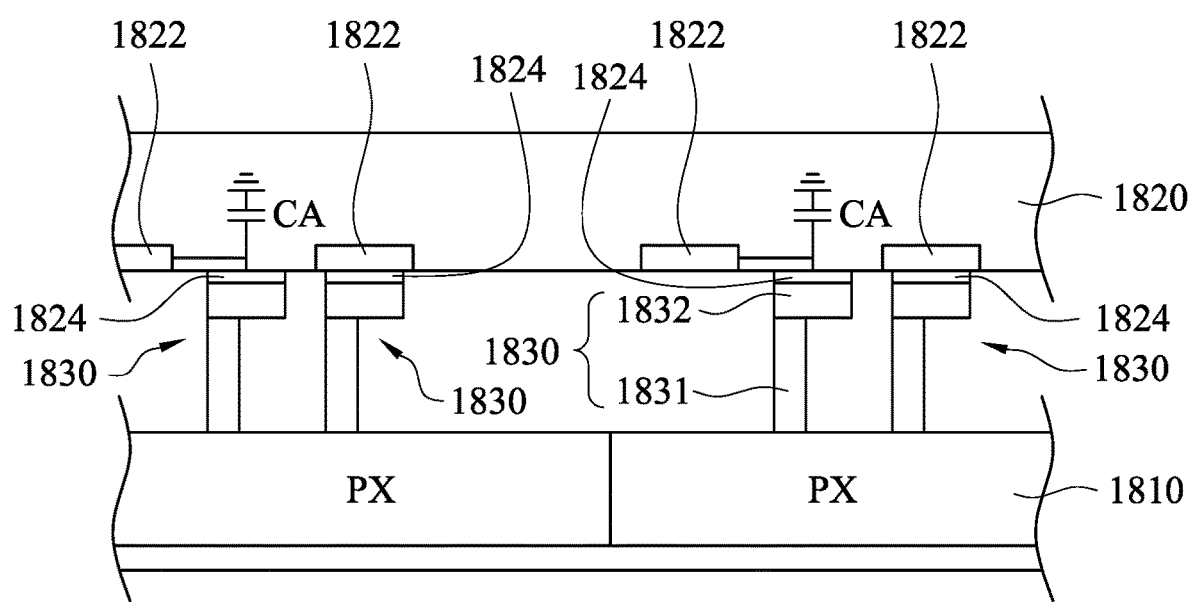
FIG. 18 is a schematic cross-sectional view of an image sensor in accordance with some embodiments of the present disclosure.

Referring to FIG. 18, FIG. 18 is a schematic cross-sectional view of an image sensor 1800 in accordance with some embodiments of the present disclosure. The image sensor 1800 includes a sensor wafer 1810, a circuit wafer 1820 and plural connection members 1830. The sensor wafer 1810 includes plural pixel units PX configured to convert various photo energy of light into electrical signals. In some embodiments, the above pixel unit 100, 200, 300, 400, 600, 700, 800, 1100, 1200, 1300 or 1400 is applied for each of the pixel units PX. The circuit wafer 1820 includes plural peripheral circuits 1822 corresponding to the pixel units PX, plural contacts 1824 of the peripheral circuits 1822, and plural capacitors CA. In some embodiments, the peripheral circuit 1822 may be an amplifier circuit (for example, a source follower circuit), a reset circuit and/or a selection circuit. The connection members 1830 are configured to electrically connect the pixel units PX of the sensor wafer 1810 to the peripheral circuits 1822 of the circuit wafer 1820, thereby achieving pixel level bonding. In some embodiments, each of the connection members 1830 includes a first portion 1831 and a second portion 1832. The second portion 1832 is wider than the first portion 1831, thereby enabling the connection members 1830 has a shape of funnel. In some embodiments, the first portion 1831 is disposed on the contact of the pixel unit PX (for example, the contact 182 of the pixel unit 100), and the second portion 1832 is disposed on the contact 1824, thereby connecting the pixel unit PX to the corresponding peripheral circuit 1822.

The capacitors CA are electrically connected to the pixel units PX in a one-to-one manner to store the electrical signals outputted from the light-sensitive elements of the pixel units PX. For example, each of the capacitors CA is electrically connected between a contact of the pixel unit PX (for example, the contact 182 of the pixel unit 100) and a corresponding peripheral circuit 1822. When the pixel units PX output electrical signals to the peripheral circuits 1822, the electrical signals of the pixel units PX are temporarily stored in the capacitors CA at first. Then, the electrical signals of the pixel units PX are transmitted to the peripheral circuit 1822.

In a conventional image sensor, a multi-share pixel design is applied. Thus, a peripheral circuit of the conventional image sensor is shared by multiple pixel units the conventional image sensor. However, in the image sensor 1800, no multi-share pixel design is applied. Therefore, global globe shutter and operation time reduction are achieved.

In accordance with some embodiments of the present disclosure, a method for fabricating an image sensor is provided. The method includes doping a bottom portion of a semiconductor substrate with a first dopant to form a light-sensitive element in the bottom portion of the semiconductor substrate; etching a top portion of the semiconductor substrate to form a post structure on the light-sensitive element; forming a gate structure on at least one sidewall of the post structure, wherein the gate structure exposes a first part of the bottom portion of the semiconductor substrate; doping the exposed first part of the bottom portion of the semiconductor substrate with a second dopant to form a pinning layer on the light-sensitive element, wherein the second dopant has a conductivity type opposite that of the first dopant; and forming a contact on the post structure.

In accordance with some embodiments of the present disclosure, a method for fabricating an image sensor is provided. The method includes doping a semiconductor substrate to form a light-sensitive element in a bottom portion of the semiconductor substrate; etching a top portion of the semiconductor substrate to form a post structure on the light-sensitive element; forming a gate structure having a first portion on a sidewall of the post structure and a second portion extending along a top surface of the bottom portion of the semiconductor substrate; and forming a gate contact on the second portion of the gate structure.

In accordance with some embodiments of the present disclosure, a method for fabricating an image sensor is provided. The method includes forming a first light-sensitive pixel unit and a second light-sensitive pixel unit neighboring the first light-sensitive pixel unit in a sensor wafer, wherein each of the first light-sensitive pixel unit and the second light-sensitive pixel unit comprises a light-sensitive element; forming a first source contact over the light-sensitive element of the first light-sensitive pixel unit and a second source contact over the light-sensitive element of the second light-sensitive pixel unit; and bonding the sensor wafer to a circuit wafer, such that a first pixel circuit of the circuit wafer is connected to the first source contact of the sensor wafer, and a second pixel circuit of the circuit wafer is connected to the second source contact of the sensor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an image sensor, the method comprising:
    doping a bottom portion of a semiconductor substrate with a first dopant to form a light-sensitive element in the bottom portion of the semiconductor substrate;
    etching a top portion of the semiconductor substrate to form a post structure on the light-sensitive element;
    forming a gate structure on at least one sidewall of the post structure, wherein the gate structure exposes a first part of the bottom portion of the semiconductor substrate;
    after forming the gate structure, etching the exposed first part of the bottom portion of the semiconductor substrate, such that a top surface of the exposed first part of the bottom portion of the semiconductor substrate is lower than a top surface of a second part of the bottom portion of the semiconductor substrate below the gate structure;
    after etching the exposed first part of the bottom portion of the semiconductor substrate, doping the exposed first part of the bottom portion of the semiconductor substrate with a second dopant to form a pinning layer on the light-sensitive element, wherein the second dopant has a conductivity type opposite a conductivity type of the first dopant, and a top surface of the pinning layer is lower than the top surface of the second part of the bottom portion of the semiconductor substrate below the gate structure; and
    forming a contact on the post structure.

2. The method of claim 1, wherein a top surface of the post structure is higher than a top surface of the gate structure.

3. The method of claim 1, wherein after doping the exposed first part of the bottom portion of the semiconductor substrate with the second dopant, the second part of the bottom portion of the semiconductor substrate below the gate structure is free of the second dopant.

4. The method of claim 1, wherein the pinning layer is laterally offset from the post structure.

5. The method of claim 1, further comprises:
doping the second part of the bottom portion of the semiconductor substrate with a third dopant to form a doped region over the light-sensitive element, wherein the third dopant has a same conductivity type as the conductivity type of the first dopant, and the post structure is over the doped region.

6. The method of claim 1, wherein forming the gate structure comprises:
forming a gate dielectric layer over the semiconductor substrate;
depositing a gate conductive layer over the gate dielectric layer, wherein the gate conductive layer and the gate dielectric layer covers the first part of the bottom portion of the semiconductor substrate; and
etching the gate conductive layer and the gate dielectric layer to form the gate structure.

7. The method of claim 1, wherein a doping concentration of the second dopant in the pinning layer is greater than a doping concentration of the first dopant in the light-sensitive element.

8. A method for fabricating an image sensor, the method comprising:
doping a semiconductor substrate to form a light-sensitive element in a bottom portion of the semiconductor substrate;
etching a top portion of the semiconductor substrate to form a post structure on the light-sensitive element;
forming a gate structure having a first portion on a sidewall of the post structure and a second portion extending along a top surface of the bottom portion of the semiconductor substrate;
forming a pinning layer in the semiconductor substrate and on the light-sensitive element, wherein the pinning layer is in contact with a bottom surface of the second portion of the gate structure, and has a conductivity type opposite a conductivity type of the light-sensitive element; and
forming a gate contact on the second portion of the gate structure.

9. The method of claim 8, wherein the first and second portions of the gate structure are over the light-sensitive element from a top view.

10. The method of claim 8, wherein a top surface of the first portion of the gate structure is higher than a top surface of the second portion of the gate structure.

11. The method of claim 8, further comprising:
doping a part of the top portion of the semiconductor substrate to form an ohmic contact layer prior to etching the top portion of the semiconductor substrate.

12. The method of claim 11, further comprising:
forming a source contact on the post structure, wherein the source contact is in contact with the ohmic contact layer.

13. The method of claim 8, wherein forming the gate structure comprises:

forming a gate dielectric layer on the sidewall of the post structure and the top surface of the bottom portion of the semiconductor substrate;
depositing a gate conductive layer over the gate dielectric layer; and
etching the gate conductive layer and the gate dielectric layer to form the gate structure.

14. The method of claim 8, wherein the gate structure exposes a part of the bottom portion of the semiconductor substrate, and forming the pinning layer comprises:
doping the exposed part of the bottom portion of the semiconductor substrate to form the pinning layer on the light-sensitive element.

15. A method for fabricating an image sensor, the method comprising:
forming a light-sensitive element in a semiconductor substrate;
forming an ohmic contact node above the light-sensitive element;
etching the semiconductor substrate to form a post structure between the light-sensitive element and the ohmic contact node;
depositing a gate conductive layer over the post structure and the ohmic contact node;
etching the gate conductive layer into a gate conductor around the post structure, wherein a top surface of the gate conductor is below a bottom surface of the ohmic contact node; and
after etching the gate conductive layer into the gate conductor around the post structure, forming a first doped region in the post structure between the top surface of the gate conductor and the bottom surface of the ohmic contact node, wherein the first doped region surrounds a portion of the post structure, and the first doped region has a conductivity type the same as that of the light-sensitive element.

16. The method of claim 15, wherein etching the gate conductive layer into the gate conductor is performed such that a bottom surface of the gate conductor is higher than a top surface of the light-sensitive element.

17. The method of claim 15, further comprising:
forming a source contact over the ohmic contact node; and
forming a gate contact over the gate conductor.

18. The method of claim 15, further comprising:
forming a second doped region in the semiconductor substrate over the light-sensitive element prior to forming the ohmic contact node, wherein the second doped region comprises a same conductivity type as that of the light-sensitive element, wherein etching the semiconductor substrate to form the post structure is performed such that the second doped region is etched to form a protrusion portion below the post structure.

19. The method of claim 15, further comprising:
forming a gate dielectric layer, wherein a bottom surface of the gate dielectric layer is higher than a top surface of the semiconductor substrate; and
forming a pinning region in the semiconductor substrate, wherein the pinning region is in contact with the gate dielectric layer.

* * * * *